(12) United States Patent
Fujimori et al.

(10) Patent No.: US 9,064,593 B2
(45) Date of Patent: Jun. 23, 2015

(54) DATA HOLDING DEVICE AND LOGIC OPERATION CIRCUIT USING THE SAME

(71) Applicant: Rohm Co., Ltd., Kyoto (JP)

(72) Inventors: Yoshikazu Fujimori, Kyoto (JP); Hiromitsu Kimura, Kyoto (JP); Toshiyuki Kanaya, Kyoto (JP); Daisuke Notsu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/574,973

(22) Filed: Dec. 18, 2014

(65) Prior Publication Data

US 2015/0103580 A1    Apr. 16, 2015

Related U.S. Application Data

(63) Continuation of application No. 14/466,201, filed on Aug. 22, 2014, now Pat. No. 8,947,904, which is a continuation of application No. 13/436,151, filed on Mar. 30, 2012, now Pat. No. 8,837,194.

(30) Foreign Application Priority Data

Apr. 1, 2011  (JP) .................................. 2011-081587

(51) Int. Cl.
  *G11C 11/22*    (2006.01)
(52) U.S. Cl.
  CPC ...................................... *G11C 11/22* (2013.01)
(58) Field of Classification Search
  CPC ........................................................ G11C 11/22
  USPC ............... 365/49.13, 65, 109, 117, 145, 148;
    257/295, E21.208, E21.663, E21.664,
    257/E27.104, E29.164; 438/3
  See application file for complete search history.

(56) References Cited

U.S. PATENT DOCUMENTS

| | | | |
|---|---|---|---|
| 2002/0027798 A1* | 3/2002 | Takashima | 365/145 |
| 2003/0058701 A1* | 3/2003 | Takashima | 365/200 |
| 2004/0042293 A1* | 3/2004 | Ogino | 365/202 |
| 2004/0090812 A1* | 5/2004 | Takashima | 365/145 |
| 2005/0063225 A1* | 3/2005 | Takashima | 365/199 |
| 2007/0058413 A1* | 3/2007 | Lin et al. | 365/145 |
| 2007/0211510 A1* | 9/2007 | Madan et al. | 365/65 |
| 2008/0080295 A1* | 4/2008 | Namekawa et al. | 365/230.06 |
| 2009/0010038 A1* | 1/2009 | Madan et al. | 365/145 |
| 2010/0226164 A1* | 9/2010 | Nagashima et al. | 365/148 |
| 2010/0328988 A1* | 12/2010 | Nagashima et al. | 365/148 |

FOREIGN PATENT DOCUMENTS

WO    2009/025346    2/2009

* cited by examiner

*Primary Examiner* — Harry W Byrne
(74) *Attorney, Agent, or Firm* — Fish & Richardson P.C.

(57) ABSTRACT

A data holding device includes a loop structure unit configured to hold data using a plurality of logic gates connected in a loop shape, a nonvolatile storage unit including a plurality of ferroelectric elements, the nonvolatile storage unit configured to store the data held in the loop structure unit in a nonvolatile manner using hysteresis characteristics of the ferroelectric elements, and a circuit separation unit configured to electrically separate the loop structure unit and the nonvolatile storage unit. The ferroelectric elements of the nonvolatile storage unit are surrounded by a dummy element smaller in width than the ferroelectric elements.

7 Claims, 31 Drawing Sheets

<LAYOUT>

<ACTUAL SHAPE>

<LAYOUT>

<ACTUAL SHAPE>

<LAYOUT>

<ACTUAL SHAPE>

<LAYOUT> <ACTUAL SHAPE>

FIG. 30
(PRIOR ART)

DATA HOLDING DEVICE AND LOGIC OPERATION CIRCUIT USING THE SAME

CROSS-REFERENCE TO RELATED APPLICATION

This application is based upon and claims the benefit of priority from Japanese Patent Application No. 2011-81587, filed on Apr. 1, 2011, the entire contents of which is incorporated herein by reference.

TECHNICAL FIELD

The present disclosure relates to a data holding device and a logic operation circuit using the same.

BACKGROUND

In a related art, it is proposed to develop a cell pattern layout capable of matching the shapes of ferroelectric elements and eventually increasing pairing properties thereof in a data holding device for storing data in a nonvolatile manner using the hysteresis characteristics of ferroelectric elements.

In the layout design of a semiconductor integrated circuit device, it is often the case that a dummy pattern is provided adjacent to a cell pattern to be used in order to suppress the etching loading effect attributable to the density (sparseness and denseness) of a mask pattern.

For example, if a memory array is formed on a semiconductor substrate, as shown in FIG. 30, dummy cells C identical in size with memory cells A and memory cells B are provided adjacent to the memory cells A such that the density of a mask pattern is not generated between the memory cells A arranged in the terminal end portions (mainly, the outer peripheral portions) of the memory array and the memory cells B arranged in the portions of the memory array other than the terminal end portions. Since the memory array is formed of a plurality of the memory cells A and B, the ratio of the area occupied by the dummy cells C to the total area of the memory array does not become so large even though the dummy cells C are identical in size with the memory cells A and the memory cells B.

However, if dummy elements Y and ferroelectric elements X, which are identical in size, are provided in a dada holding device employing a small number of (e.g., four) ferroelectric elements X as shown in FIG. 31, the ratio of the area occupied by the dummy elements Y to the total area of the data holding device becomes very large. For that reason, the size of the ferroelectric elements X should be small in order to avoid an enlargement of a chip area. This causes a problem because the reliability of the data holding device is lowered. In order to avoid the impairment of the reliability of the data holding device, the chip area itself needs to be increased, thereby increasing the manufacturing cost of the data holding device.

SUMMARY

The present disclosure provides one embodiment of a data holding device capable of appropriately reducing variations in the characteristics of ferroelectric elements attributable to the density of a mask pattern, and a logic operation circuit using the data holding device.

According to one aspect of the present disclosure, a data holding device is provided. The data holding device includes a loop structure unit, a nonvolatile storage unit, and a circuit separation unit. The loop structure is configured to hold data using a plurality of logic gates connected in a loop shape. The nonvolatile storage unit includes a plurality of ferroelectric elements and is configured to store the data held in the loop structure unit in a nonvolatile manner using hysteresis characteristics of the ferroelectric elements. The circuit separation unit is configured to electrically separate the loop structure unit and the nonvolatile storage unit. With this configuration, the ferroelectric elements included in the nonvolatile storage unit are surrounded by a dummy element smaller in width than the ferroelectric elements.

In one embodiment, the dummy element may be formed into a closed circular shape.

In another embodiment, a first inter-element distance between the ferroelectric elements spaced apart each other and a second inter-element distance between the ferroelectric elements and the dummy element spaced apart each other may be set equal to each other.

In another embodiment, the loop structure unit may include a first multiplexer including a first input terminal connected to an input signal application terminal via a first pass switch, a first logic gate including an input terminal connected to an output terminal of the first multiplexer and an output terminal connected to an output signal output terminal, a second multiplexer including a first input terminal connected to the output terminal of the first logic gate, and a second logic gate including an input terminal connected to an output terminal of the second multiplexer and an output terminal connected to the first input terminal of the first multiplexer via a second pass switch.

In another embodiment, the nonvolatile storage unit may include a first ferroelectric element including a first terminal connected to a first plate line and a second terminal connected to the first input terminal of the first multiplexer via a third pass switch and also to a second input terminal of the second multiplexer. In addition, the nonvolatile storage unit may include a second ferroelectric element including a first terminal connected to the first plate line and a second terminal connected to the first input terminal of the second multiplexer via a fourth pass switch and also to a second input terminal of the first multiplexer.

In another embodiment, the nonvolatile storage unit may further include a third ferroelectric element including a first terminal connected to a second plate line and a second terminal connected to the second terminal of the first ferroelectric element. Moreover, the nonvolatile storage unit may further include a fourth ferroelectric element including a first terminal connected to the second plate line and a second terminal connected to the second terminal of the second ferroelectric element.

In another embodiment, the first ferroelectric element, the second ferroelectric element, the third ferroelectric element and the fourth ferroelectric element may be arranged in a two-row two-column lattice shape.

In another embodiment, the circuit separation unit may share the first multiplexer and the second multiplexer with the loop structure unit and may share the third pass switch and the fourth pass switch with the nonvolatile storage unit.

According to another aspect of the present disclosure, a logic operation circuit is provided. The logic operation circuit includes the data holding device of any one of the above configurations as a latch or a register.

BRIEF DESCRIPTION OF THE DRAWINGS

Figure 30:
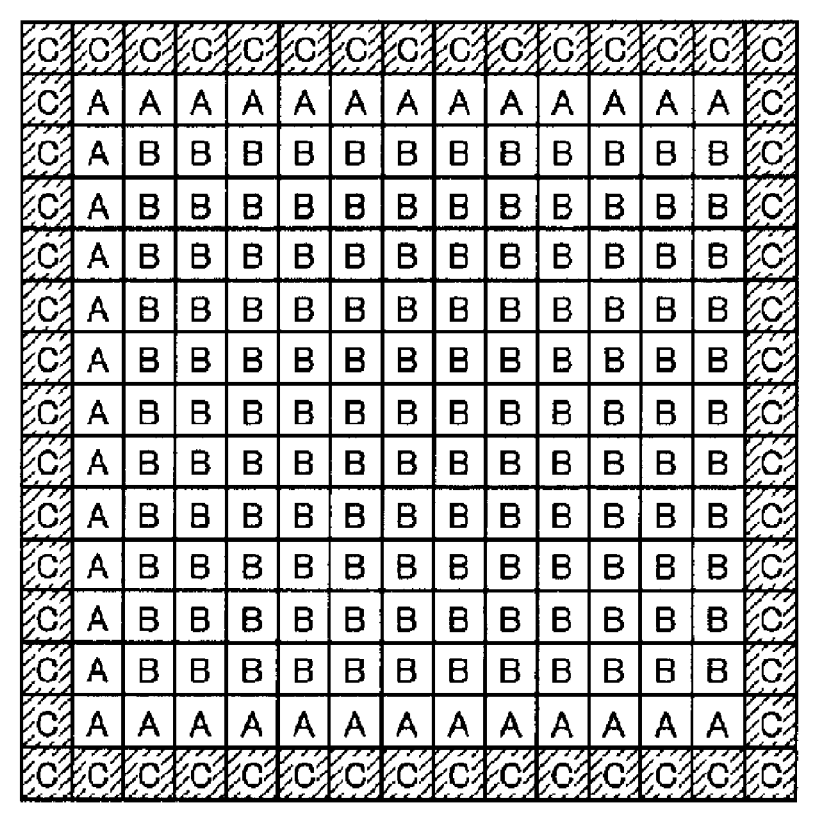

FIG. 30 is a schematic diagram illustrating a dummy pattern.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and elements have not been described in detail so as not to unnecessarily obscure aspects of the various embodiments.

<Data Holding Device>

Figure 1:
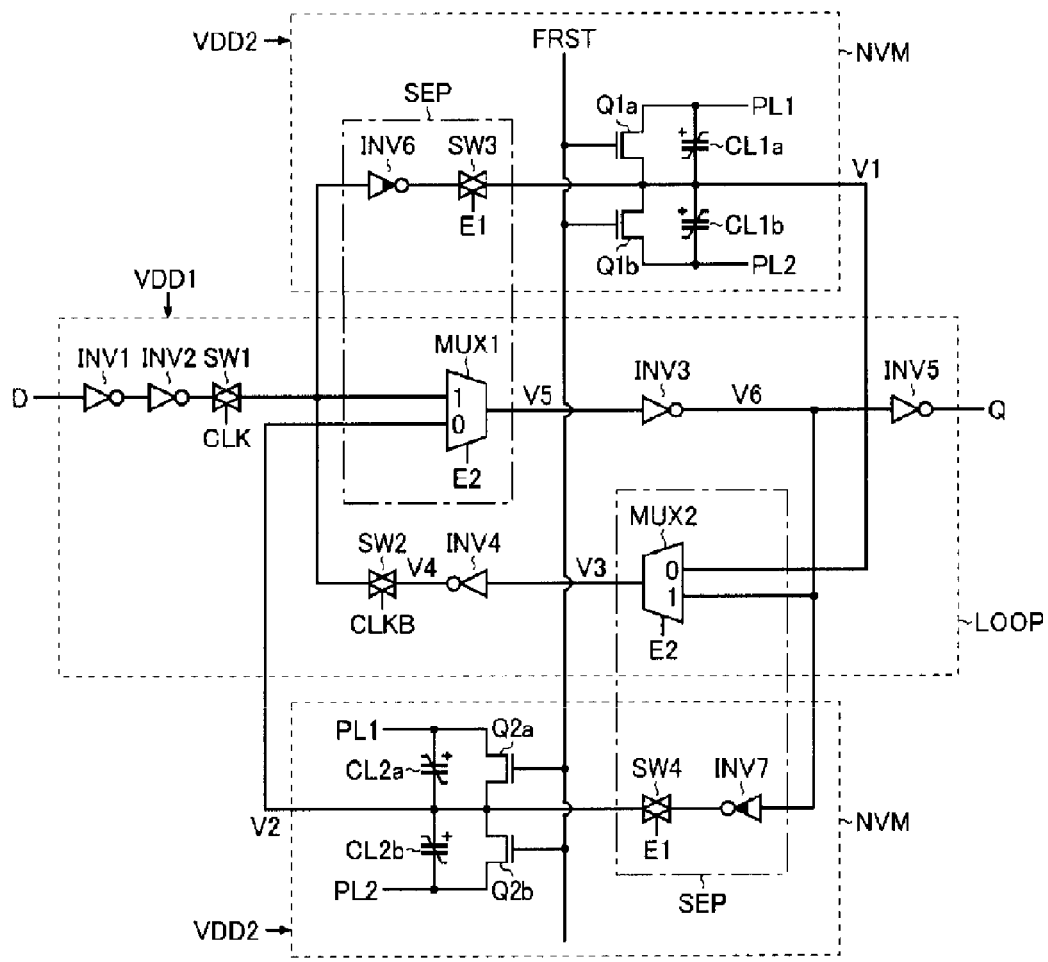
FIG. 1 is a circuit diagram illustrating one embodiment of a data holding device according to the present disclosure.

FIG. 1 is a circuit diagram illustrating one embodiment of a data holding device according to the present disclosure.

Referring to FIG. 1, the data holding device of one embodiment is a latch circuit including inverters INV1 through INV7, pass switches SW1 through SW4, multiplexers MUX1 and MUX2, N-channel-type field effect transistors Q1$a$, Q1$b$, Q2$a$ and Q2$b$, and ferroelectric elements (ferroelectric capacitors) CL1$a$, CL1$b$, CL2$a$ and CL2$b$.

The input terminal of the inverter INV1 is connected to an application terminal of a data signal (D). The output terminal of the inverter INV1 is connected to the input terminal of the inverter INV2. The output terminal of the inverter INV2 is connected to the first input terminal (1) of the multiplexer MUX1 via the pass switch SW1. The output terminal of the multiplexer MUX1 is connected to the input terminal of the inverter INV3. The output terminal of the inverter INV3 is connected to the input terminal of the inverter INV5. The output terminal of the inverter INV5 is connected to an extraction terminal of an output signal (Q). The first input terminal (1) of the multiplexer MUX2 is connected to the output terminal of the inverter INV3. The output terminal of the multiplexer MUX2 is connected to the input terminal of the inverter INV4. The output terminal of the inverter INV4 is connected to the first input terminal (1) of the multiplexer MUX1 via the pass switch SW2.

As set forth above, the data holding device of the present embodiment includes a loop structure unit LOOP that holds the input data signal D using two logic gates (the inverters INV3 and INV4 in FIG. 1) connected to each other in a loop shape.

The loop structure unit LOOP is supplied and driven by a first power supply voltage VDD1 (of, e.g., 0.6 V).

The input terminal of the inverter INV6 is connected to the first input terminal (1) of the multiplexer MUX1. The output terminal of the inverter INV6 is connected to the second input terminal (0) of the multiplexer MUX2 via the pass switch SW3. The input terminal of the inverter INV7 is connected to the first input terminal (1) of the multiplexer MUX2. The output terminal of the inverter INV7 is connected to the second input terminal (0) of the multiplexer MUX1 via the pass switch SW4.

The positive terminal of the ferroelectric element CL1$a$ is connected to a first plate line PL1. The negative terminal of the ferroelectric element CL1$a$ is connected to the second input terminal (0) of the multiplexer MUX2. The transistor Q1$a$ is connected between the opposite terminals of the ferroelectric element CL1$a$. The gate of the transistor Q1$a$ is connected to an application terminal of an F reset signal FRST.

The positive terminal of the ferroelectric element CL1b is connected to the second input terminal (0) of the multiplexer MUX2. The negative terminal of the ferroelectric element CL1b is connected to a second plate line PL2. The transistor Q1b is connected between the opposite terminals of the ferroelectric element CL1b. The gate of the transistor Q1b is connected to the application terminal of an F reset signal FRST.

The positive terminal of the ferroelectric element CL2a is connected to the first plate line PL1. The negative terminal of the ferroelectric element CL2a is connected to the second input terminal (0) of the multiplexer MUX1. The transistor Q2a is connected between the opposite terminals of the ferroelectric element CL2a. The gate of the transistor Q2a is connected to the application terminal of an F reset signal FRST.

The positive terminal of the ferroelectric element CL2b is connected to the second input terminal (0) of the multiplexer MUX1. The negative terminal of the ferroelectric element CL2b is connected to the second plate line PL2. The transistor Q2b is connected between the opposite terminals of the ferroelectric element CL2b. The gate of the transistor Q2b is connected to the application terminal of an F reset signal FRST.

As set forth above, the data holding device of the one embodiment includes a nonvolatile storage unit NVM that stores the data D held in the loop structure unit LOOP in a nonvolatile manner using the hysteresis characteristics of the ferroelectric elements (CL1a, CL1b, CL2a and CL2b).

The nonvolatile storage unit NVM is supplied and driven by a second power supply voltage VDD2 (of, e.g., 1.2 V) higher than the first power supply voltage VDD1.

Among the elements stated above, the pass switch SW1 is switched on and off in response to a clock signal CLK and the pass switch SW2 is switched on and off in response to an inverted clock signal CLKB (a logically inverted signal of the clock signal CLK). In other words, the pass switch SW1 and the pass switch SW2 are switched on and off in a mutually exclusive (complementary) manner.

On the other hand, the pass switches SW3 and SW4 are switched on and off in response to a control signal E1. The signal paths of the multiplexers MUX1 and MUX2 are switched in response to a control signal E2. In other words, the multiplexers MUX1 and MUX2, the inverters INV6 and INV7 and the pass switches SW3 and SW4 of the data holding device of the present embodiment function as a circuit separation unit SEP for electrically separating the loop structure unit LOOP and the nonvolatile storage unit NVM.

Among the circuit elements making up the circuit separation unit SEP, the multiplexers MUX1 and MUX2 included in the loop structure unit LOOP are supplied and driven by the first power supply voltage VDD1. The pass switches SW3 and SW4 included in the nonvolatile storage unit NVM are supplied and driven by the second power supply voltage VDD2.

The inverters INV6 and INV7 are supplied and driven by the first and second power supply voltages VDD1 and VDD2. The inverters INV6 and INV7 function as a level shifter for changing the voltage level of the data D exchanged between the loop structure unit LOOP and the nonvolatile storage unit NVM.

Figure 2:
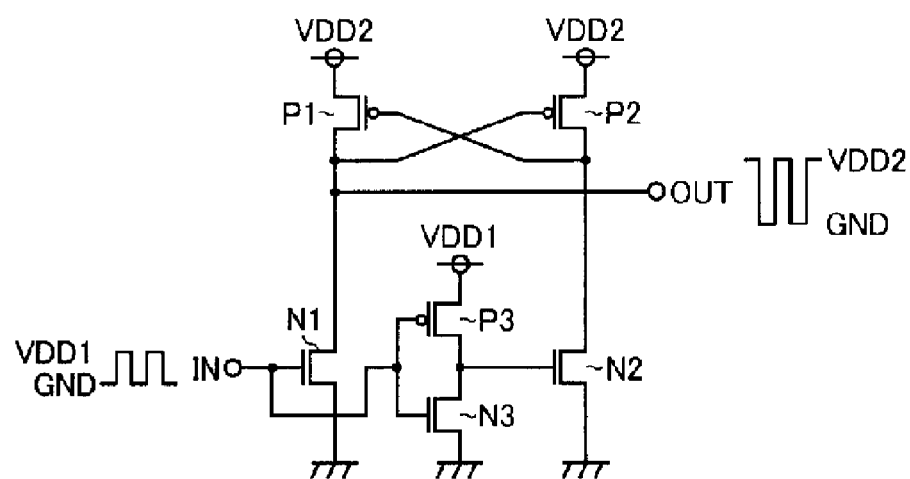
FIG. 2 is a circuit diagram illustrating one configuration of an inverter INV6 having a level shift function (this holds true in case of an inverter INV7).

FIG. 2 is a circuit diagram illustrating one configuration of the inverter INV6 having a level shift function. The inverter INV7 includes similar functions and performs similarly as the inverter INV6.

Referring to FIG. 2, the inverter INV6 includes P-channel-type MOS field effect transistors P1 through P3 and N-channel-type MOS field effect transistors N1 through N3. The gate of the transistor N1 is connected to an input terminal N. The source of the transistor N1 is connected to a grounding terminal. The drain of the transistor N1 is connected to the drain of the transistor P1 and also to an output terminal OUT. The sources of the transistors P1 and P2 are connected to the application terminal of the second power supply voltage VDD2. The gate of the transistor P1 is connected to the drain of the transistor P2. The gate of the transistor P2 is connected to the drain of the transistor P1. The drain of the transistor P2 is connected to the drain of the transistor N2. The source of the transistor N2 is connected to the grounding terminal. The gates of the transistors P3 and N3 are connected to the input terminal N. The source of the transistor P3 is connected to the application terminal of the first power supply voltage VDD1. The drain of the transistor P3 is connected to the drain of the transistor N3 and also to the gate of the transistor N2. The source of the transistor N3 is connected to the grounding terminal.

In the inverter INV6 configured as above, if a logic signal of a high level (the first power supply voltage VDD1) is inputted to the input terminal IN, the transistors N1 and P2 are switched on, and the transistors N2 and P1 are switched off. Thus, a logic signal of a low level (the ground voltage GND) is outputted from the output terminal OUT. On the contrary, if a logic signal of low level (the ground voltage GND) is inputted to the input terminal IN, the transistors N1 and P2 are switched off, and the transistors N2 and P1 are switched on. Thus, a logic signal of a high level (the second power supply voltage VDD2) is outputted from the output terminal OUT. In other words, the inverter INV6 inverts the logic of the logic signal inputted to the input terminal IN and raises the high level electric potential of the inverted logic signal from the first power supply voltage VDD1 to the second power supply voltage VDD2. Then, the inverted logic signal is outputted from the inverter INV6.

Next, the operation of the data holding device configured as above will be explained in detail. In the following description, the node voltages of the respective parts will be designated by reference symbols. V1 denotes the voltage appearing at the connection node of the ferroelectric elements CL1a and CL1b. V2 denotes the voltage appearing at the connection node of the ferroelectric elements CL2a and CL2b. V3 denotes the voltage appearing at the input terminal of the inverter INV4. V4 denotes the voltage appearing at the output terminal of the inverter INV4. V5 denotes the voltage appearing at the input terminal of the inverter INV3. V6 denotes the voltage appearing at the output terminal of the inverter INV3.

Figure 3:
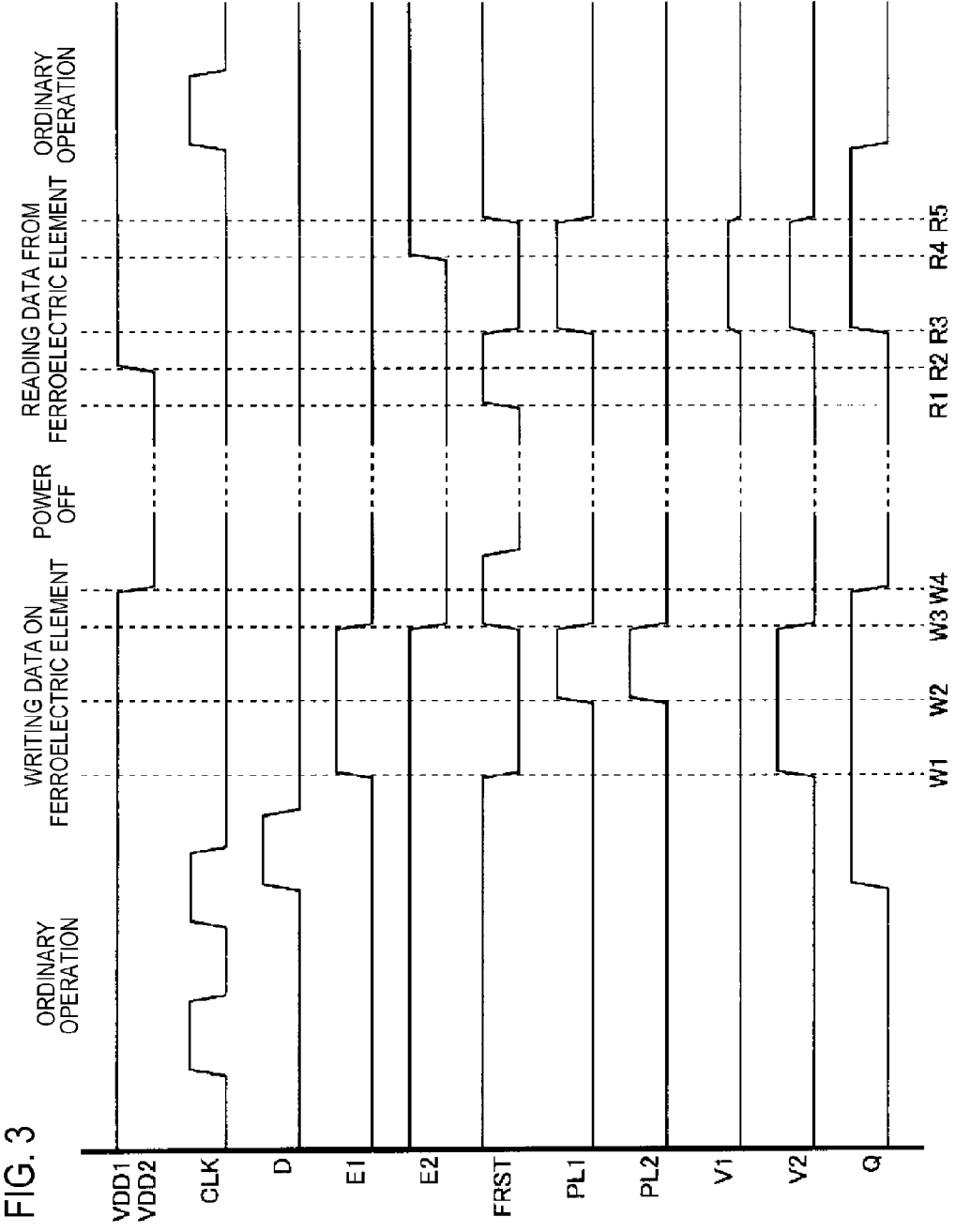
FIG. 3 is a timing chart for explaining one operation example of the data holding device according to the present disclosure.

FIG. 3 is a timing chart for explaining one operation of the data holding device according to one embodiment of the present disclosure. In FIG. 3, the voltage waveforms of the power supply voltages (VDD1 and VDD2), the clock signal CLK, the data signal D, the control signal E1, the control signal E2, the F reset signal FRST, the application voltage of the first plate line PL1, the application voltage of the second plate line PL2, the node voltage V1, the node voltage V2 and the output signal Q are shown in the named order from above.

First, the ordinary operation of the data holding device will be described.

Up to the time point W1, the F reset signal FRST is kept at "1 (the high level: VDD2)" and the transistors Q1a, Q1b, Q2a and Q2b are switched on, whereby the respective opposite terminals of the ferroelectric elements CL1a, CL1b, CL2a and CL2b remain short-circuited. In this state, no voltage is applied to the ferroelectric elements CL1a, CL1b, CL2a and CL2b. The first plate line PL1 and the second plate line PL2 are kept at "0 (the low level: GND)".

Up to the time point W1, the control signal E1 is kept at "0 (the low level: GND)" and the pass switches SW3 and SW4 are switched off. Thus, the data writing drivers (i.e., the inverters INV6 and INV7 as shown in FIG. 1) remain disabled.

Further, the control signal E2 is kept at "1 (VDD1)" and the first input terminals (1) of the multiplexers MUX1 and MUX2 are selected. Thus, an ordinary loop is formed in the loop structure unit LOOP.

Accordingly, during the time period in which the clock signal CLK is kept at a high level, the first pass switch SW1 is switched on and the second pass switch SW2 is switched off. Thus, the data signal D is directly outputted as the output signal Q. On the other hand, during the time period in which the clock signal CLK is kept at a low level, the first pass switch SW1 is switched off and the second pass switch SW2 is switched on. Thus, the data signal D is latched at the falling edge of the clock signal CLK.

Figure 4:
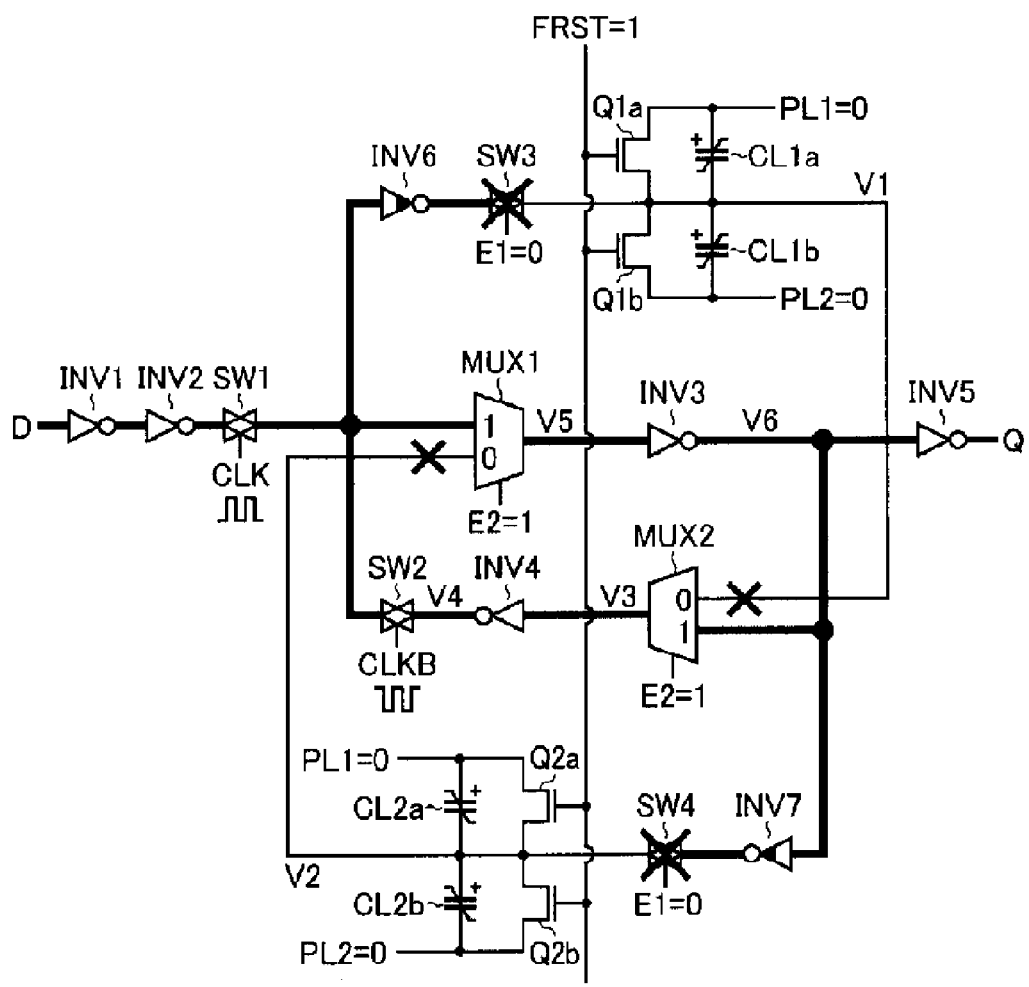
FIG. 4 is a circuit diagram illustrating a signal pass during an ordinary operation.

FIG. 4 is a circuit diagram illustrating a signal path (indicated by thick lines in the diagram) during the ordinary operation.

Next, the operation of writing data into the ferroelectric elements will be described.

During the period between time points W1 and W3, the clock signal CLK is kept at "0 (GND)" and the inverted clock signal CLKB is kept at "1 (VDD1)". That is, the first pass switch SW1 is switched off and the second pass switch SW2 is switched on. By deciding beforehand the logics of the clock signal CLK and the inverted clock signal CLKB in this manner, it is possible to increase the stability of the data writing operation performed with respect to the ferroelectric elements.

Further, the F reset signal FRST is kept at "0 (GND)" and the transistors Q1a, Q1b, Q2a and Q2b are switched off. In this state, it becomes possible to apply a voltage to the ferroelectric elements CL1a, CL1b, CL2a and CL2b.

In addition, during the period between the time points W1 and W3, the control signal E1 is kept at "1 (VDD2)" and the third and fourth pass switches SW3 and SW4 is switched on. Thus, the data writing drivers (the inverters INV6 and INV7 as shown in FIG. 1) is enabled.

During this time, the control signal E2 is kept at "1 (VDD1)" as before and the first input terminals (1) of the multiplexers MUX1 and MUX2 are selected. Thus, an ordinary loop is formed in the loop structure unit LOOP.

During the period from the time point W1 to the time point W2, the first plate line PL1 and the second plate line PL2 are kept at "0 (GND)". During the period from the time point W2 to the time point W3, the first plate line PL1 and the second plate line PL2 are kept at "1 (VDD2)." In other words, an identical pulse voltage is applied to the first plate line PL1 and the second plate line PL2. As the pulse voltage is applied in this manner, the residual polarization state within each of the ferroelectric elements is set into one of an inverted state and a non-inverted state.

FIG. 3 will be described in more detail. At the time point W1, the output signal Q is kept at "1 (VDD1)". The node voltage V1 becomes "0 (GND)" and the node voltage V2 becomes "1 (VDD2)". Accordingly, if the first plate line PL1 and the second plate line PL2 are kept at "0 (GND)" during the period from the time point W1 to the time point W2, no voltage is applied between the opposite terminals of the ferroelectric elements CL1a and CL1b. A negative voltage is applied between the opposite terminals of the ferroelectric element CL2a and a positive voltage is applied between the opposite terminals of the ferroelectric element CL2b. On the other hand, if the first plate line PL1 and the second plate line PL2 are kept at "1 (VDD2)" during the period from the time point W2 to the time point W3, no voltage is applied between the opposite terminals of the ferroelectric elements CL2a and CL2b. A positive voltage is applied between the opposite terminals of the ferroelectric element CL1a, and a negative voltage is applied between the opposite terminals of the ferroelectric element CL1b.

If the pulse voltage is applied to the first plate line PL1 and the second plate line PL2 in this manner, the residual polarization state within each of the ferroelectric elements becomes one of an inverted state and a non-inverted state. Moreover, the residual polarization states are opposite from each other between the ferroelectric elements CL1a and CL1b and between the ferroelectric elements CL2a and CL2b. Likewise, the residual polarization states are opposite from each other between the ferroelectric elements CL1a and CL2a and between the ferroelectric elements CL1b and CL2b.

At the time point W3, the F reset signal FRST becomes "1 (VDD2)" again, whereby the transistors Q1a, Q1b, Q2a and Q2b are switched on and the respective opposite terminals of the ferroelectric elements CL1a, CL1b, CL2a and CL2b remain short-circuited. In this state, no voltage is applied to the ferroelectric elements CL1a, CL1b, CL2a and CL2b. At this time, the first plate line PL1 and the second plate line PL2 are kept at "0 (GND)".

Further, at the time point W3, the control signal E1 becomes "0 (GND)" again, whereby the third and fourth pass switches SW3 and SW4 are switched off. Thus, the data writing drivers (the inverters INV6 and INV7 as shown in FIG. 1) become disabled. The control signal E2 is kept at "0 (GND)" as shown in FIG. 3, although the control signal E2 does not matter.

At the time point W4, the supply of the first power supply voltage VDD1 to the loop structure unit LOOP and the supply of the second power supply voltage VDD2 to the nonvolatile storage unit NVM are all cut off. At this time, the F reset signal FRST is kept at "1 (VDD2)" from the time point W3 and the transistors Q1a, Q1b, Q2a and Q2b are switched on. The respective opposite terminals of the ferroelectric elements CL1a, CL1b, CL2a and CL2b remain short-circuited. Accordingly, no voltage is applied to the ferroelectric elements CL1a, CL1b, CL2a and CL2b. As a result, even if a voltage is changed when turning the power off, there is no possibility that a voltage is unintentionally applied to the ferroelectric elements CL1a, CL1b, CL2a and CL2b. Accordingly, data corruption may be avoided.

Figure 5:
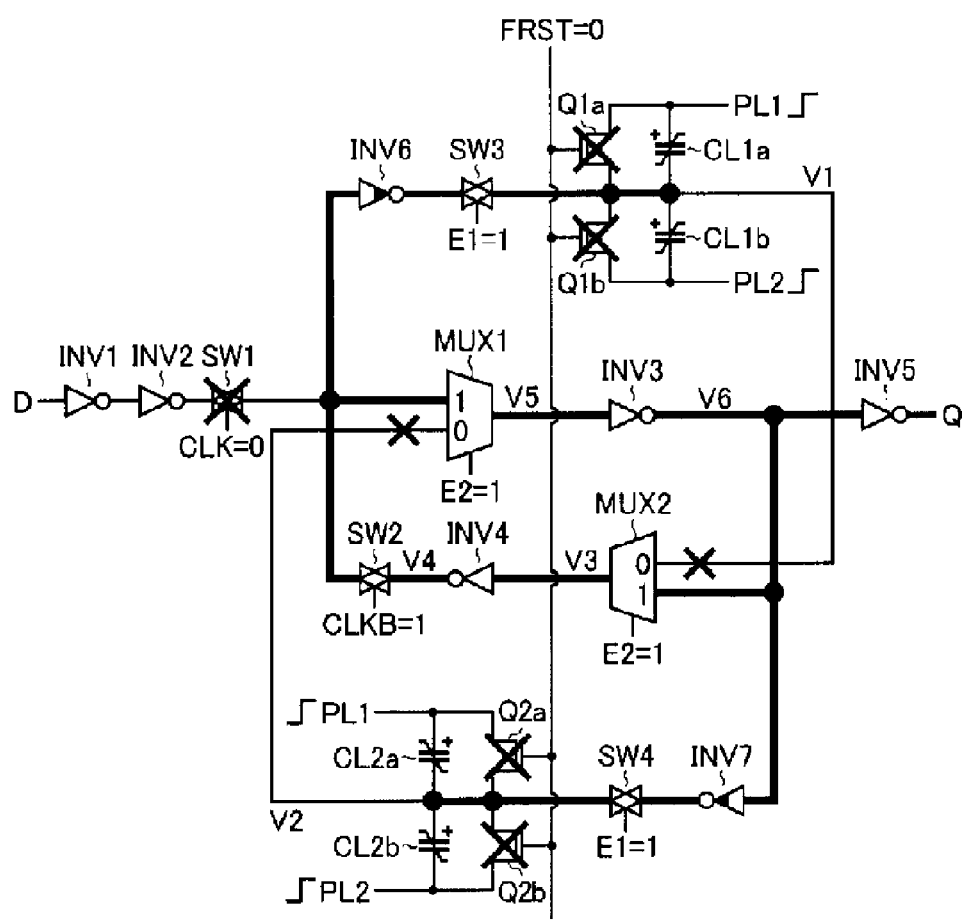
FIG. 5 is a circuit diagram illustrating a signal path during a data writing operation.

FIG. 5 is a circuit diagram illustrating a signal path (indicated by thick lines in the diagram) during the data writing operation, particularly, during the period from the time point W1 to the time point W3.

Next, the operation of reading data from the ferroelectric elements will be described.

During the period from the time point R1 to R5, the clock signal CLK is kept at "0 (GND)" and the inverted clock signal CLKB is kept at "1 (VDD1)". Thus, the first pass switch SW1 is switched off and the second pass switch SW2 is switched on. By determining beforehand the logics of the clock signal CLK and the inverted clock signal CLKB in this manner, it is possible to increase the stability of the data reading operation performed with respect to the ferroelectric elements.

At the time point R1, the F reset signal FRST is initially kept at "1 (VDD1)" and the transistors Q1a, Q1b, Q2a and Q2b are switched on. The respective opposite terminals of the ferroelectric elements CL1a, CL1b, CL2a and CL2b remain short-circuited. Accordingly, no voltage is applied to the ferroelectric elements CL1a, CL1b, CL2a and CL2b. As a result, even if a voltage is changed at the power-on time, there is no possibility that a voltage is unintentionally applied to the ferroelectric elements CL1a, CL1b, CL2a and CL2b. Accordingly, data corruption may be avoided.

At the time point R1, the first plate line PL1 and the second plate line PL2 are kept at "0 (the low level: GND)".

At the time point R2, the first power supply voltage VDD1 is applied to the loop structure unit LOOP, and the second power supply voltage VDD2 is applied to the nonvolatile storage unit NVM, in a state that the control signals E1 and E2 are kept at "0 (GND)." Specifically, this state is when the data writing drivers become disabled and the ordinary loop become disabled in the loop structure unit LOOP. At this time, the signal lines indicated by thick lines in FIG. 6 come into a loading state.

Then, at the time point R3, the F reset signal FRST is kept at "0 (GND)" and the transistors Q1a, Q1b, Q2a and Q2b are switched on. Thus, it becomes possible to apply a voltage to the ferroelectric elements CL1a, CL1b, CL2a and CL2b. On the other hand, the first plate line PL1 is kept at "1 (VDD2)" while the second plate line PL2 is kept at "0 (GND)". As the pulse voltage is applied in this manner, voltage signals corresponding to the residual polarization states within the ferroelectric elements appear as node voltages V1 and V2.

Next, FIG. 3 will be described in detail. A relatively low voltage signal (the logic of which will be called WL [Weak Low] herein below) appears as the node voltage V1. A relatively high voltage signal (the logic of which will be called WH [Weak High] herein below) appears as the node voltage V2. In other words, a voltage difference corresponding to the difference in the residual polarization states within the ferroelectric elements is generated between the node voltage V1 and the node voltage V2.

During the period from the time point R3 to the time point R4, the control signal E2 is kept at "0 (GND)" and the second input terminals (0) of the multiplexers MUX1 and MUX2 are selected. Thus, the logic of the node voltage V3 becomes WL and the logic of the node voltage V4 becomes WH. In addition, the logic of the node voltage V5 becomes WH and the logic of the node voltage V6 becomes WL. As set forth above, during the period from the time point R3 to the time point R4, the node voltages V1 through V6 in the respective parts of the data holding device remains unstable because the logics are not completely inverted in the inverters INV3 and INV4 and the output logics thereof are not reliably kept at "0 (GND)"/"1 (VDD1)".

Then, at the time point R4, the control signal E2 is kept at "1 (VDD1)" and the first input terminals (1) of the multiplexers MUX1 and MUX2 are selected. Thus an ordinary loop is formed in the loop structure unit LOOP. As the signal paths are switched in this manner, the output terminal of the inverter INV4 having the logic WH and the input terminal of the inverter INV3 having the logic WH are connected to each other, and the output terminal of the inverter INV3 having the logic WL and the input terminal of the inverter INV4 having the logic WL are connected to each other. Accordingly, mismatching is not generated in the signal logics (WH/WL) of the respective nodes. During the time period in which an ordinary loop is formed in the loop structure unit LOOP, the inverter INV3 receives the input of the logic WL and raises the output logic thereof to "1 (VDD1)". The inverter INV4 receives the input of the logic WH and lowers the output logic thereof to "0 (GND)". As a result, the output logic of the inverter INV3 changes from the unstable logic WL to "0 (GND)." Further, the output logic of the inverter INV4 changes from the unstable logic WH to "1 (VDD1)."

As stated above, at the time point R4, the signal read out from the ferroelectric elements (the electric potential difference between the node voltage V1 and the node voltage V2) is amplified in the loop structure unit LOOP as the loop structure unit LOOP becomes the ordinary loop. The data held prior to turning the power off (the "1 (VDD1)" as shown in FIG. 2) is restored as the output signal Q.

Thereafter, at the time point R5, the F reset signal FRST becomes "1 (VDD2)" again and the transistors Q1a, Q1b, Q2a and Q2b are switched on, whereby the respective opposite terminals of the ferroelectric elements CL1a, CL1b, CL2a and CL2b remain short-circuited. In this state, no voltage is applied to the ferroelectric elements CL1a, CL1b, CL2a and CL2b. At this time, the first plate line PL1 and the second plate line PL2 are kept at "0 (GND)". Accordingly, the data holding device return to the same state as before the time point W1, i.e., the ordinary operation state.

Figure 6:
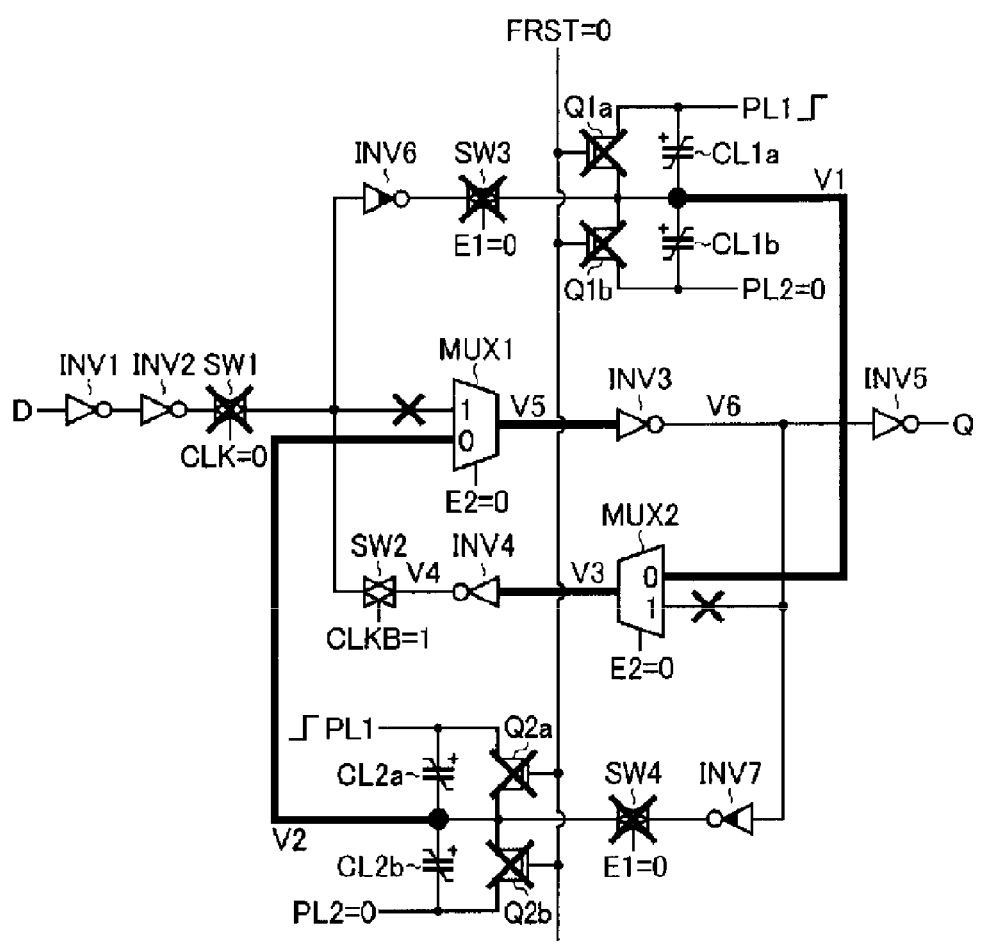
FIG. 6 is a circuit diagram illustrating a signal path during a data reading operation.

FIG. 6 is a circuit diagram illustrating a signal path (indicated by thick lines in the diagram) during the data reading operation, particularly, during the period from the time point R3 to the time point R4.

As described above, the data holding device of the one embodiment includes the loop structure unit LOOP for holding data through the use of the logic gates (the inverters INV3 and INV4 in FIG. 1) connected in a loop shape, the nonvolatile storage unit NVM (CL1a, CL1b, CL2a, CL2b, Q1a, Q1b, Q2a and Q2b) for storing the data held in the loop structure unit LOOP in a nonvolatile manner using the hysteresis characteristics of the ferroelectric elements, and the circuit separation unit SEP (MUX1, MUX2, INV6, INV7, SW3 and SW4) for electrically separating the loop structure unit LOOP and the nonvolatile storage unit NVM. During the ordinary operation of the data holding device, the circuit separation unit SEP is configured to keep constant the voltage applied to the ferroelectric elements, and to electrically operate the loop structure unit LOOP.

As set forth above, the ferroelectric elements CL1a, CL1b, CL2a and CL2b are not directly driven through the use of the signal lines of the loop structure unit LOOP. The data writing drivers (the inverters INV6 and INV7 in FIG. 1) functioning as buffers are provided between the signal lines of the loop structure unit LOOP and the ferroelectric elements CL1a, CL1b, CL2a and CL2b. Accordingly, the ferroelectric elements CL1a, CL1b, CL2a and CL2b may be prevented from becoming a load capacitance within the loop structure unit LOOP.

With the configuration in which the third and fourth pass switches SW3 and SW4 are connected to the output terminals of the data writing drivers (the inverters INV6 and INV7 as shown in FIG. 1) and are switched on only at the data writing time in response to the control signal E1, the ferroelectric elements CL1a, CL1b, CL2a and CL2b may be prevented from being operated during the ordinary operation time.

During the data reading time, the input/output paths of the multiplexers MUX1 and MUX2 are switched in response to the control signal E2. This makes it possible to control the connection and disconnection between the logic gates (the inverters INV3 and INV4 in FIG. 1) and the ferroelectric elements CL1a, CL1b, CL2a and CL2b. Accordingly, there is no need to additionally install a high-load clock line in order to have a specific node floated. Therefore, an increase in power consumption may be avoided.

The control signals E1 and E2 are additionally needed in the data holding device of the one embodiment. Unlike the clock signals generated at all times, the control signals E1 and E2 are not generated at the normal time, and therefore, the control signals E1 and E2 have little influence on the power consumption of the data holding device.

In the data holding device of the one embodiment, it is necessary to additionally use the data writing drivers (the inverters INV6 and INV7) and the multiplexers MUX1 and MUX2. However, the area occupied by the data holding device in the operation circuit such as a CPU (Central Processing Unit) etc., is no more than several percent of the operation circuit. Because the area occupied by the data holding device is minimal in the operational circuit, the increase in such area has little influence on the operation circuit as a whole.

As described above, with the data holding device of the one embodiment, the ferroelectric elements are not unnecessarily driven during the ordinary operation time. It is therefore possible to realize the same level of speed and power consumption available in a volatile data holding device.

In other words, the data holding device of the one embodiment can be treated just like a volatile data holding device. As such, it is possible to replace a memory device part of an existing circuit with the data holding device of the one embodiment without having to redesign the timing and the power consumption. Accordingly, an existing circuit can be made nonvolatile with ease. This makes it possible to realize, for example, a CPU capable of turning the power off without losing data during the standby time and capable of resuming the operation immediately upon turning the power on.

In the data holding device of the one embodiment, the loop structure unit LOOP and the nonvolatile storage unit NVM are individually supplied and driven by the first and second power supply voltages VDD1 and VDD2 differing from each other. The circuit separation unit SEP includes the level shifter (the inverters INV6 and INV7 having a level shift function, as shown in FIG. 1) for changing the voltage level of the data D exchanged between the loop structure unit LOOP and the nonvolatile storage unit NVM.

With the configuration described above, the loop structure unit LOOP can be driven at a low voltage using the first power supply voltage VDD1. At the same time, the nonvolatile storage unit NVM (more specifically, the ferroelectric elements CL1a, CL1b, CL2a and CL2b included in the nonvolatile storage unit NVM) can be appropriately driven using the second power supply voltage VDD2 higher than the first power supply voltage VDD1. It is therefore possible to provide a data holding device that can be incorporated into a low-voltage driven device (such as an ultra-low-voltage processor).

Figure 7:
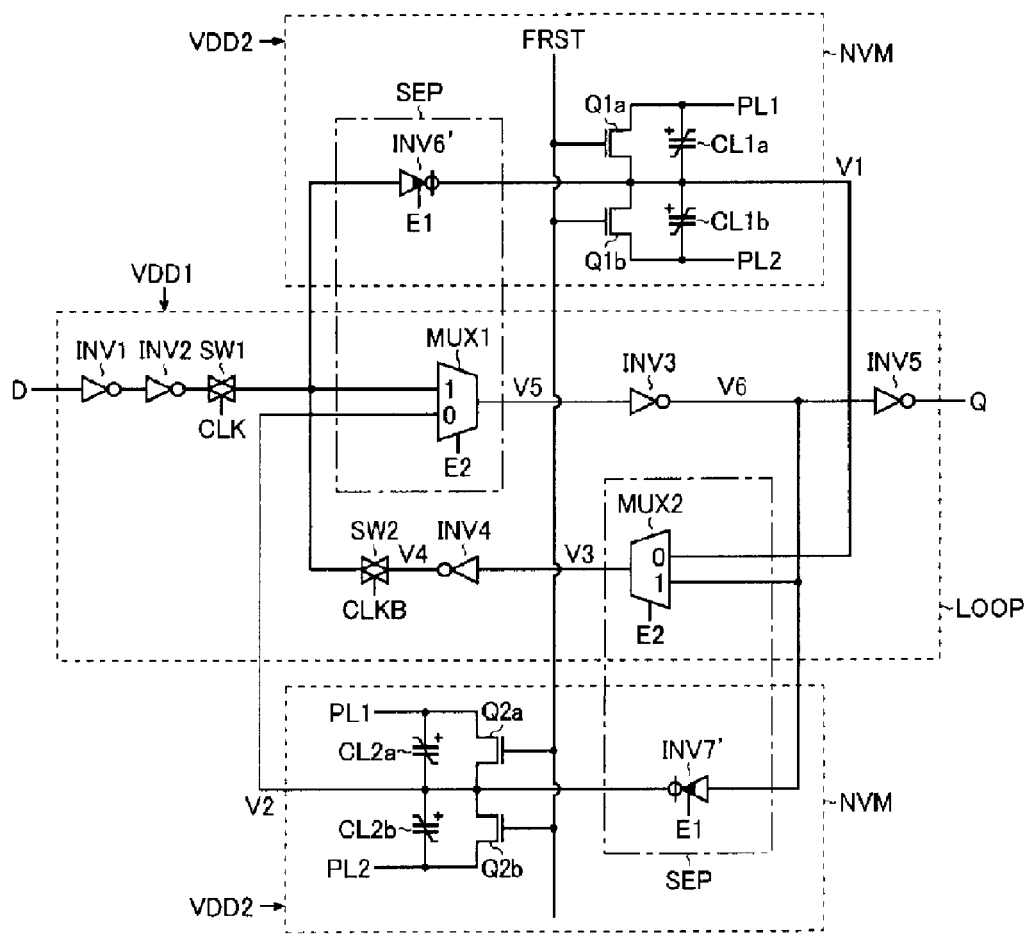
FIG. 7 is a circuit diagram illustrating a first modified example of the data holding device according to the present disclosure.
Figure 8:
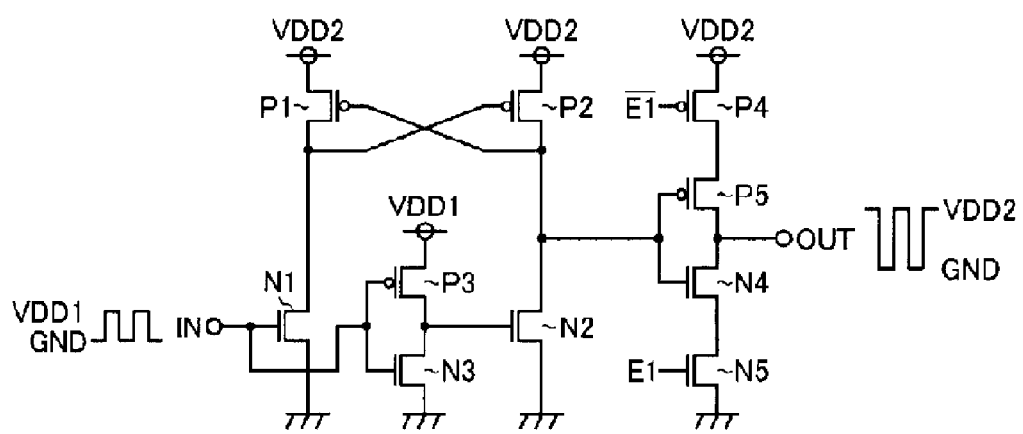
FIG. 8 is a circuit diagram illustrating one configuration of a three-state inverter INV6' having a level shift function (this holds true in case of an inverter INV7').

In the foregoing embodiment, description has been made by using a configuration in which the inverter INV6 and the third pass switch SW3 are combined with each other the inverter INV7 and the fourth pass switch SW4 are combined with each other. However, the configuration of the present disclosure is not limited thereto. As shown in FIG. 7, the third and fourth pass switches SW3 and SW4 may be omitted by employing three-state inverters INV6' and INV7' capable of keeping the output state thereof at a high impedance in response to the control signal E1. In this case, the inverter INV6' may include the configuration as shown in FIG. 8. The inverter INV7' may include similar configuration as the inverter INV6'.

FIG. 8 is a circuit diagram illustrating one configuration of the three-state inverter INV6' having a level shift function.

As shown in FIG. 8, the three-state inverter INV6' (INV7') having a level shift function can be readily realized by adding a little change to the inverter INV6 (INV7) set forth earlier. More specifically, in addition to the configuration shown in FIG. 2, the three-state inverter INV6' (INV7') is further provided with an output terminal that includes P-channel-type MOS field effect transistors P4 and P5 and N-channel-type MOS field effect transistors N4 and N5. The three-state inverter INV6' (INV7') may have a configuration in which an output signal is extracted from the output terminal.

The source of the transistor P4 as the output terminal is connected to the application terminal of the second power supply voltage VDD2. The gate of the transistor P4 is connected to the application terminal of the inverted control signal E1 bar. The drain of the transistor P4 is connected to the source of the transistor P5. The drain of the transistor P5 is connected to the drain of the transistor N4, and also to the output terminal OUT. The gates of the transistors P5 and N4 are connected to the drain of the transistor P2. The source of the transistor N4 is connected to the drain of the transistor N5. The source of the transistor N5 is connected to the grounding terminal. The gate of the transistor N5 is connected to the application terminal of the control signal E1.

If the control signal E1 is kept at a high level (the second power supply voltage VDD2) in the three-state inverter INV6' configured as above, a logic signal of low level (the ground voltage GND) is outputted from the output terminal OUT when a logic signal of high level (the first power supply voltage VDD1) is inputted to the input terminal IN. On the contrary, a logic signal of high level (the second power supply voltage VDD2) is outputted from the output terminal OUT when a logic signal of low level (the ground voltage GND) is inputted to the input terminal N. In other words, when the control signal E1 is kept at a high level, the inverter INV6' inverts the logic of the logic signal inputted to the input terminal IN and raises the high level electric potential of the inverted logic signal from the first power supply voltage VDD1 to the second power supply voltage VDD2. Then the inverted logic signal is outputted from the inverter INV6'. On the other hand, if the control signal E1 is kept at a low level (GND), the transistors P4 and N5 are switched off. Thus, the output terminal OUT comes into a high impedance state. In other words, when the control signal E1 is kept at a low level (GND), the inverter INV6' (INV7') can keep the output terminal OUT in a high impedance state regardless of the logic signal inputted to the input terminal IN. Accordingly, the use of the three-state inverters INV6' and INV7' makes it possible to omit the third and fourth pass switches SW3 and SW4 shown in FIG. 2.

Figure 9:
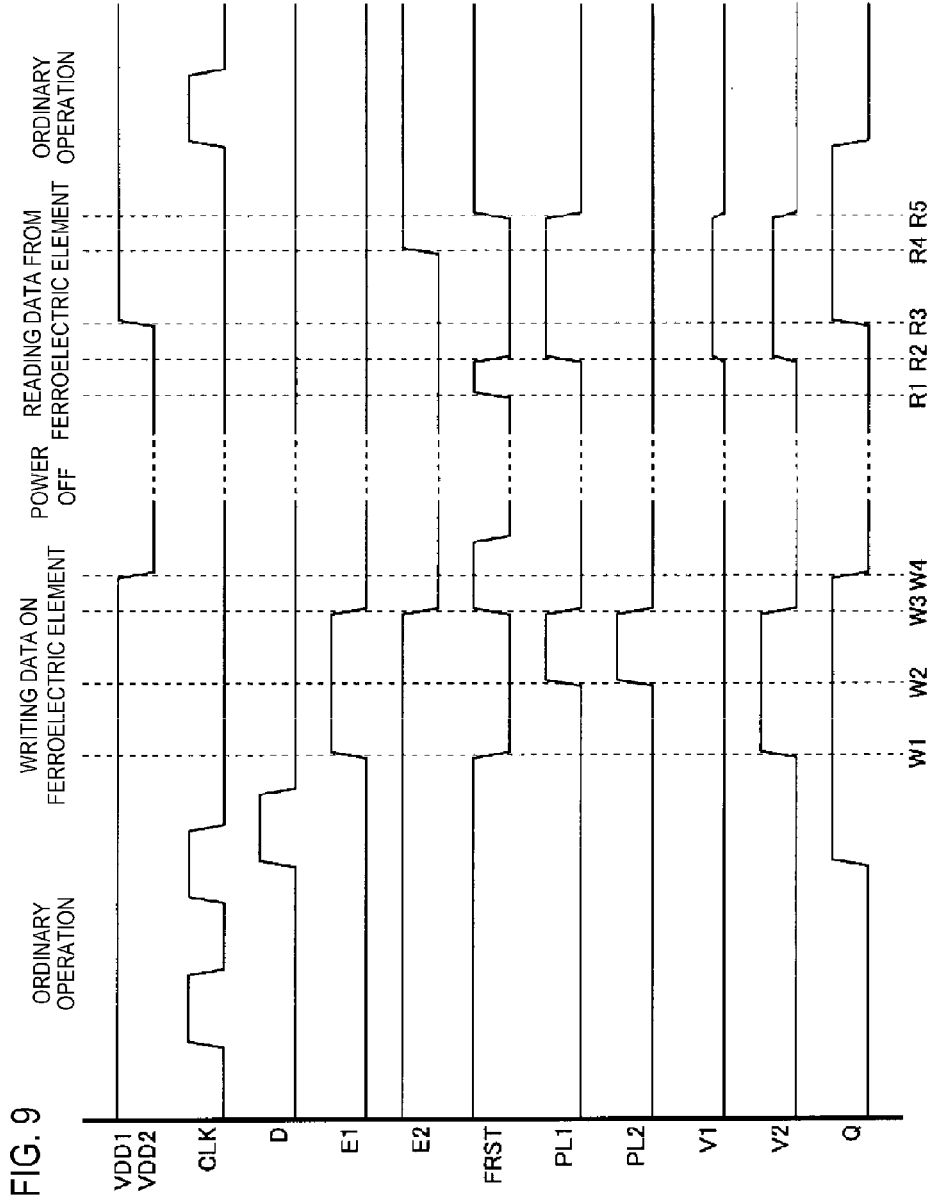
FIG. 9 is a timing chart for explaining another operation of the data holding device according to the present disclosure.

Next, a modified operation of reading data from the ferroelectric elements according to one embodiment will be described in detail with reference to FIG. 9. FIG. 9 is a timing chart for explaining another operation of the data holding device according to one embodiment of the present disclosure. In FIG. 9, the voltage waveforms of the power supply voltages (VDD1 and VDD2), the clock signal CLK, the data signal D, the control signal E1, the control signal E2, the F reset signal FRST, the application voltage of the first plate line PL1, the application voltage of the second plate line PL2, the node voltage V1, the node voltage V2 and the output signal Q are shown in the named order from above.

During the period from the time point R1 to the time point R5, the clock signal CLK is kept at "0 (GND)" and the inverted clock signal CLKB is kept at "1 (VDD1)". Thus the first pass switch SW1 is switched off and the second pass switch SW2 is switched on. By determining beforehand the logics of the clock signal CLK and the inverted clock signal CLKB in this manner, it is possible to increase the stability of the operation of reading data from the ferroelectric elements.

At the time point R1, the F reset signal FRST is initially kept at "1 (VDD2)" and the transistors Q1a, Q1b, Q2a and Q2b are switched on. The respective opposite terminals of the ferroelectric elements CL1a, CL1b, CL2a and CL2b remain short-circuited. Accordingly, no voltage is applied to the ferroelectric elements CL1a, CL1b, CL2a and CL2b. As a result, even if a voltage is changed at the power-on time, a voltage will not be unintentionally applied to the ferroelectric elements CL1a, CL1b, CL2a and CL2b. Thus, data corruption may be avoided.

Further, the first plate line PL1 and the second plate line PL2 are kept at "0 (the low level: GND)".

Next, at the time point R2, the F reset signal FRST is kept at "0 (GND)" and the transistors Q1a, Q1b, Q2a and Q2b are switched off. Thus, it becomes possible to apply a voltage to the ferroelectric elements CL1a, CL1b, CL2a and CL2b. On the other hand, the first plate line PL1 is kept at "1 (VDD2)" while the second plate line PL2 is kept at "0 (GND)". As the pulse voltage is applied in this manner, voltage signals corresponding to the residual polarization states within the ferroelectric elements appear as node voltages V1 and V2.

Next, FIG. 9 will be described in more detail. A logic WL appears as the node voltage V1, and a logic WH appears as the node voltage V2. In other words, a voltage difference corresponding to the difference in the residual polarization states within the ferroelectric elements is generated between the node voltage V1 and the node voltage V2.

During the period from the time point R2 to the time point R3, the power supply voltage VDD is not yet applied. Thus, the node voltages V3 through V6 of the respective parts of the loop structure unit LOOP become "0 (GND)". Consequently, the output signal Q is kept at "0 (GND)".

Then, at the time point R3, the first power supply voltage VDD1 is applied to the loop structure unit LOOP and the second power supply voltage VDD2 is applied to the nonvolatile storage unit NVM, in a state that the control signals E1 and E2 are kept at "0 (GND)." Specifically, in such state, the data writing drivers become disabled and the ordinary loop become disabled in the loop structure unit LOOP. At this time, the signal lines indicated by thick lines in FIG. 6 come into a floating state.

During the period from the time point R3 to the time point R4, the control signal E2 is kept at "0 (GND)" and the second input terminals (0) of the multiplexers MUX1 and MUX2 are selected. Thus, the logic of the node voltage V3 becomes WL and the logic of the node voltage V4 becomes WH. In addition, the logic of the node voltage V5 becomes WH and the logic of the node voltage V6 becomes WL. As set forth above, during the period from the time point R3 to the time point R4, the node voltages V1 through V6 in the respective parts of the data holding device remain unstable because the logics are not completely inverted in the inverters INV3 and INV4 and the output logics thereof are not reliably kept at "0 (GND)"/"1 (VDD1)".

Then, at the time point R4, the control signal E2 is kept at "1 (VDD1)" and the first input terminals (1) of the multiplexers MUX1 and MUX2 are selected. Thus, an ordinary loop is formed in the loop structure unit LOOP. As the signal paths are switched in this manner, the output terminal of the inverter INV4 (having the logic WH) and the input terminal of the inverter INV3 (having the logic WH) are connected to each other and the output terminal of the inverter INV3 (having the logic WL), and the input terminal of the inverter INV4 (having the logic WL) are connected to each other. Accordingly, mismatching is not generated in the signal logics (WH/WL) of the respective nodes. During the time period in which an ordinary loop is formed in the loop structure unit LOOP, the inverter INV3 receives the input of the logic WL and raises the output logic thereof to "1 (VDD1)". The inverter INV4 receives the input of the logic WH and lowers the output logic thereof to "0 (GND)". As a result, the output logic of the inverter INV3 changes from the unstable logic WL to "0 (GND)". The output logic of the inverter INV4 changes from the unstable logic WH to "1 (VDD1)".

As stated above, at the time point R4, the signal read out from the ferroelectric elements (the electric potential difference between the node voltage V1 and the node voltage V2) is amplified in the loop structure unit LOOP as the loop structure unit LOOP becomes the ordinary loop. The data held prior to turning the power off (the "1 (VDD1)" as shown in FIG. 9) is restored as the output signal Q.

Thereafter, at the time point R5, the F reset signal FRST becomes "1 (VDD2)" again and the transistors Q1a, Q1b, Q2a and Q2b are switched on, whereby the respective opposite terminals of the ferroelectric elements CL1a, CL1b, CL2a and CL2b remain short-circuited. In this state, no voltage is applied to the ferroelectric elements CL1a, CL1b, CL2a and CL2b. At this time, the first plate line PL1 and the second plate line PL2 are kept at "0 (GND)". Accordingly, the data holding device is restored to the same state as before the time point W1, i.e., the ordinary operation state.

Unlike the data reading operation shown in FIG. 3, the data reading operation shown in FIG. 9 is configured such that the extraction operation of the voltage signals (the node voltages V1 and V2) corresponding to the residual polarization states within the ferroelectric elements is started prior to applying the first power supply voltage VDD1 and the second power supply voltage VDD2. With this configuration, it is possible to reduce the number of operation steps performed after applying the first power supply voltage VDD1 and the second power supply voltage VDD2. That is, the operation example shown in FIG. 9 requires only two steps at the time points R4 and R5 while the operation example shown in FIG. 3 requires three steps at the time points R3, R4 and R5. Thus, this makes it possible to shorten the time required in restoration to the ordinary operation.

<Ferroelectric Element>

Next, description will be made in detail on the characteristics of the ferroelectric elements used in the data holding device of the present embodiment.

Figure 10:
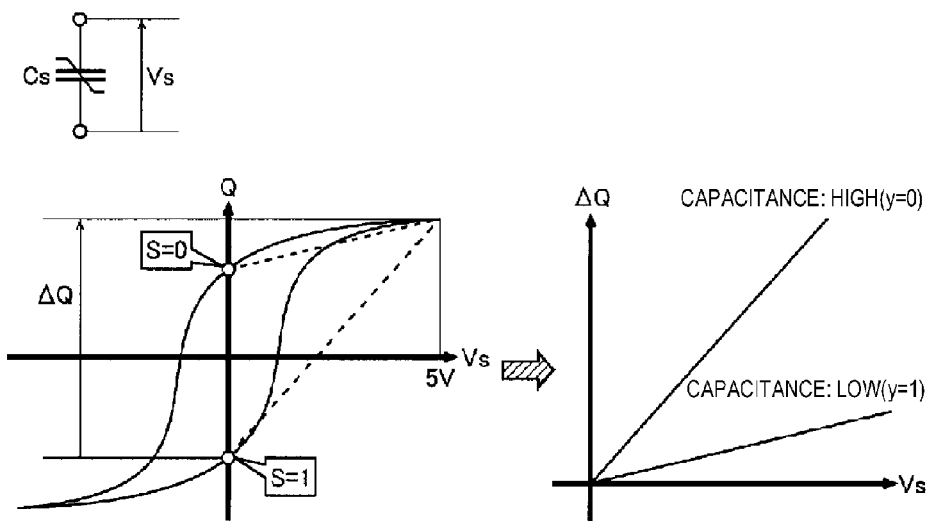
FIG. 10 is a view for explaining the characteristics of ferroelectric elements.

FIG. 10 is a view for explaining the characteristics of ferroelectric elements. The upper side in FIG. 10 illustrates a schematic diagram of a situation in which a voltage Vs is applied to a ferroelectric element Cs. The lower left side in FIG. 10 illustrates a hysteresis characteristic of the ferroelectric element Cs. Further, the lower right side in FIG. 10 illustrates a capacitance characteristic of the ferroelectric element Cs.

As shown in FIG. 10, the capacitance characteristic of the ferroelectric element Cs varies depending on the residual polarization states available when the voltage Vs is applied to the opposite terminals of the ferroelectric element Cs. More specifically, if the ferroelectric element Cs is brought into a non-inverted state (S=0) by applying a positive voltage Vs between the opposite terminals of the ferroelectric element Cs, the capacitance value thereof becomes smaller. On the contrary, if the ferroelectric element Cs is brought into an inverted state (S=1) by applying a negative voltage Vs between the opposite terminals of the ferroelectric element Cs, the capacitance value thereof becomes larger. For that reason, when reading the data stored in the ferroelectric element Cs, there is a need to convert the difference between the capacitance values to a voltage value.

In light of this, the data holding device according to one embodiment is configured to read data from the nonvolatile storage unit NVM using the capacitance coupling between the ferroelectric element kept in a non-inverted state (S=0) and the ferroelectric element kept in an inverted state (S=1).

Figure 11:
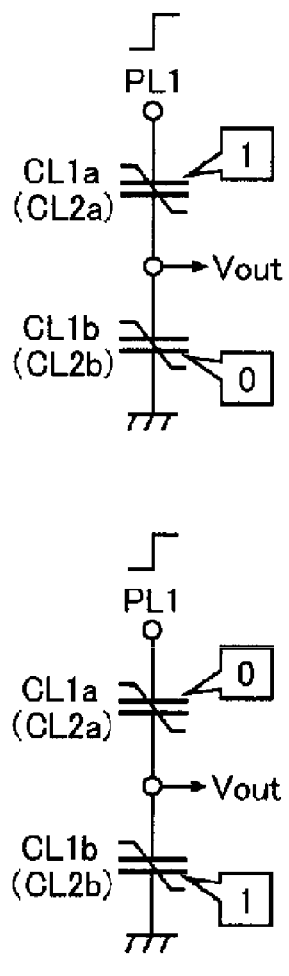
FIG. 11 is a view for explaining a data reading method that makes use of the capacitance coupling between the ferroelectric elements.
Figure 11:
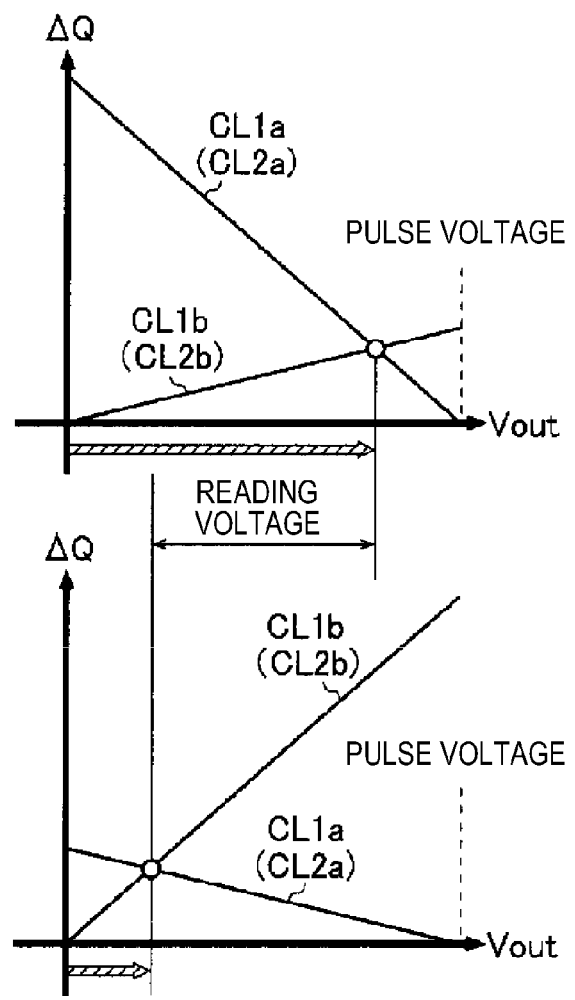

FIG. 11 is a view for explaining a data reading method that makes use of the capacitance coupling between the ferroelectric elements. The upper region of FIG. 11 illustrates a capacitance characteristic when the ferroelectric element CL1$a$ (ferroelectric element CL2$a$) is kept in an inverted state (S=1) with the ferroelectric element CL1$b$ (ferroelectric element CL2$b$) kept in a non-inverted state (S=0). Further, the lower region of FIG. 11 illustrates a capacitance characteristic when, contrary to the above, the ferroelectric element CL1$a$ (ferroelectric element CL2$a$) is kept in a non-inverted state (S=0) with the ferroelectric element CL1$b$ (ferroelectric element CL2$b$) kept in an inverted state (S=1).

As stated earlier, when writing data on the ferroelectric elements, the residual polarization states are opposite from each other between the ferroelectric elements CL1$a$ and CL1$b$ and between the ferroelectric elements CL2$a$ and CL2$b$. As for the capacitance characteristic, a relationship is established so that if the capacitance value of one of the ferroelectric elements grows larger, the capacitance value of the other ferroelectric element becomes smaller.

Accordingly, if the two ferroelectric elements CL1$a$ and CL1$b$ or the two ferroelectric elements CL2$a$ and CL2$b$ having the opposite residual polarization states are serially connected to each other to detect the node voltages V1 and V2 (the voltage values decided by the ratio of the capacitance values and indicated by readout voltages Vout in FIG. 11) appearing in the connection nodes between the ferroelectric elements when a pulse voltage is applied to one end of the serially connected ferroelectric elements, it is possible to increase the amplitude value of the readout voltages Vout to about 1 V, thereby greatly improving the readout margin.

The data holding device according to one embodiment is configured to perform the 0/1 determination with respect to the data read out from the nonvolatile storage unit NVM by merely comparing the node voltage V1 corresponding to the capacitance ratio of the ferroelectric elements CL1$a$ and CL1$b$ and the node voltage V2 corresponding to the capacitance ratio of the ferroelectric elements CL2$a$ and CL2$b$. As a consequence, there is no need to strictly set the threshold values of the inverters.

Figure 12:
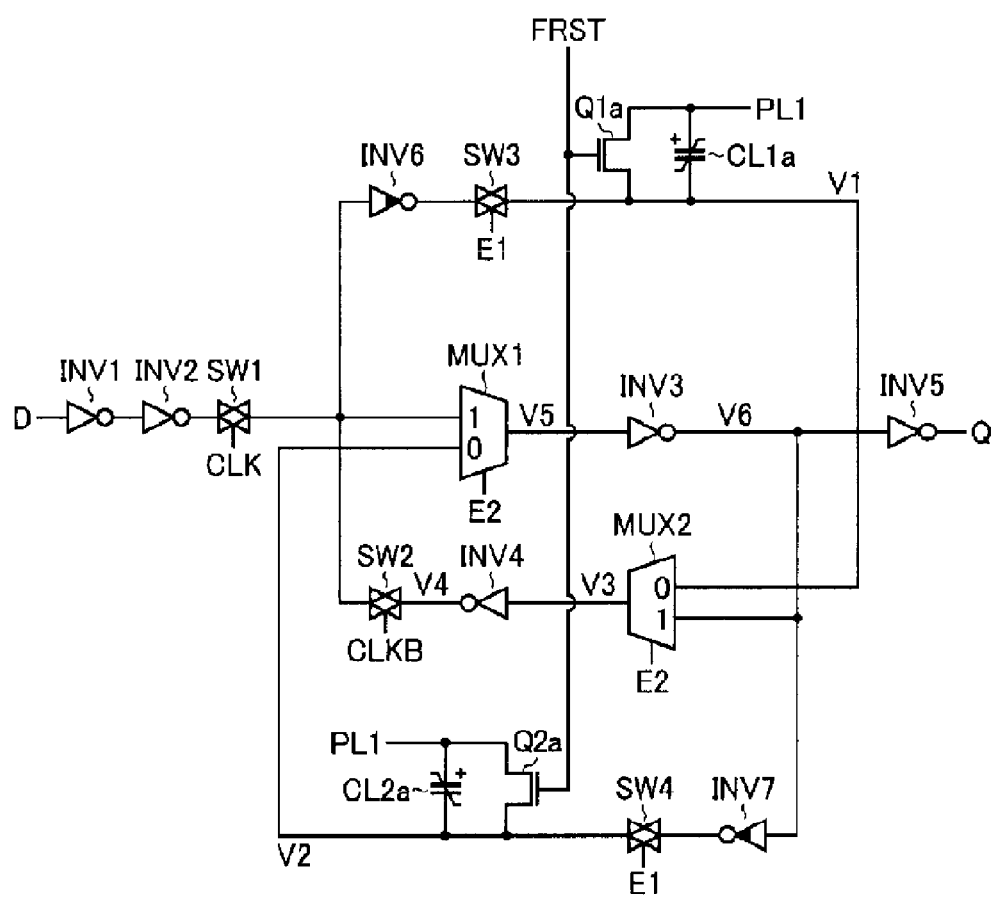
FIG. 12 is a circuit diagram illustrating the data holding device according some embodiments of the present disclosure.
Figure 13:
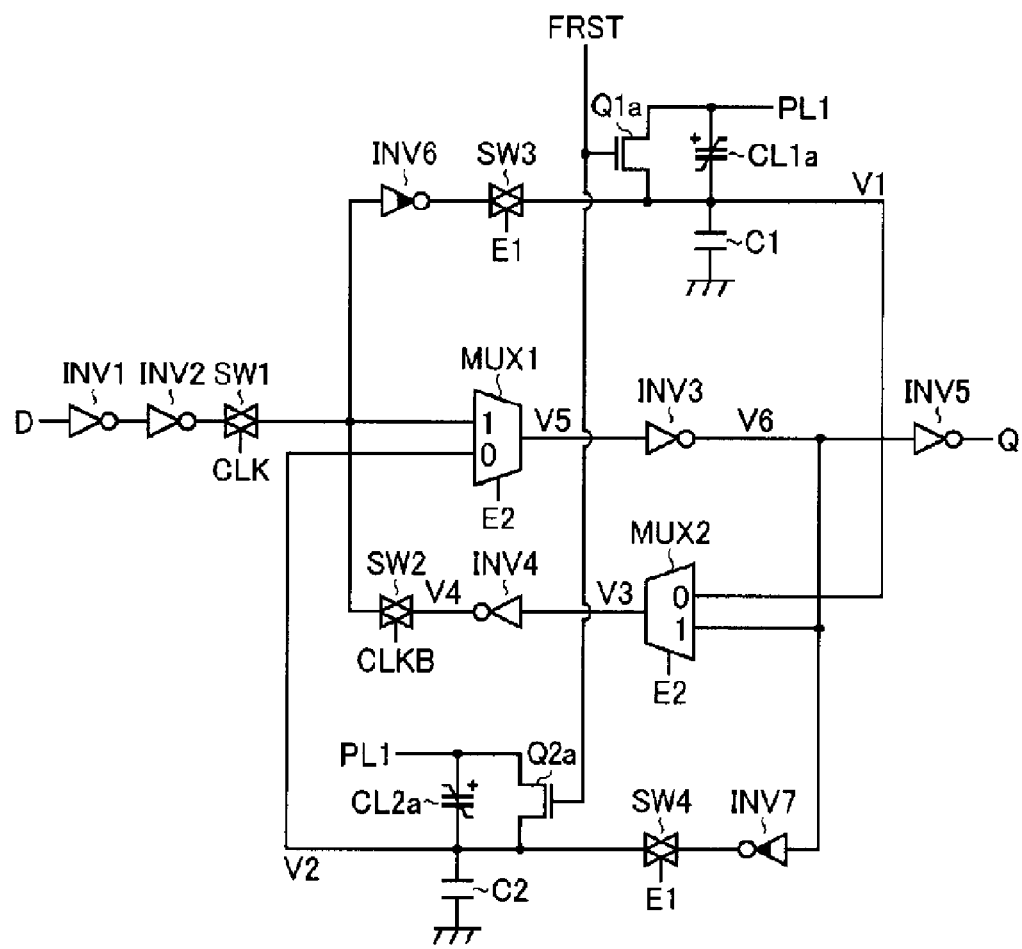
FIG. 13 is a circuit diagram illustrating the data holding device according to another embodiment of the present disclosure.

While a method of reading data through the use of capacitance coupling between the ferroelectric elements is employed in the data holding device according to one embodiment, the configuration of the present disclosure is not limited thereto. As shown in FIG. 12, it may be possible to employ a configuration in which data are read out from the nonvolatile storage unit NVM by using the capacitance coupling between the ferroelectric elements CL1$a$ and CL2$a$ and the gate capacitance of the transistors making up the inverters INV3 and INV4. Specifically, in such configuration, the ferroelectric elements CL1$b$ and CL2$b$ and the transistors Q1$b$ and Q2$b$ are removed from the configuration shown in FIG. 1. Alternatively, as shown in FIG. 13, it may be possible to employ a configuration in which data are read out from the nonvolatile storage unit NVM by using the capacitance coupling between the ferroelectric elements CL1$a$ and CL2$a$ and other capacitance elements C1 and C2.

<Application to D Flip-Flop>

Figure 14:
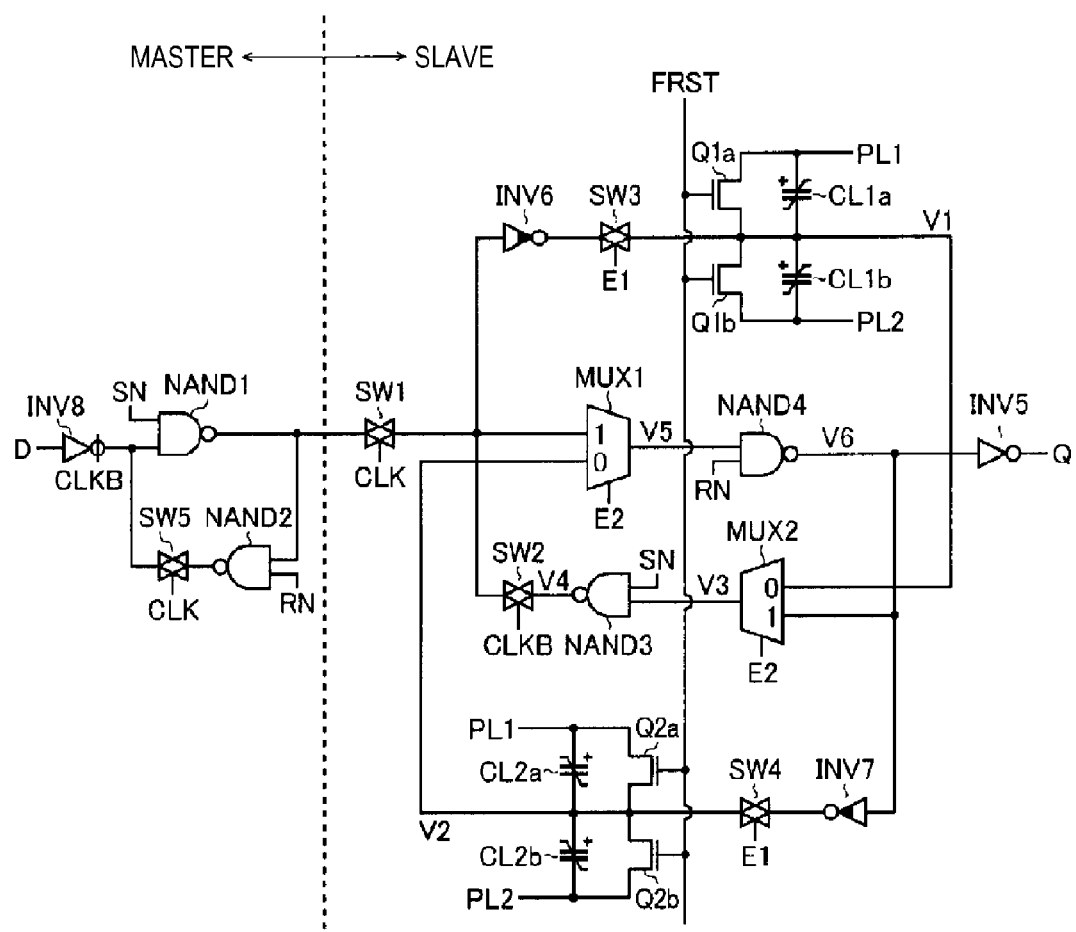
FIG. 14 is a circuit diagram illustrating an application in which the data holding device is applied to a D flip-flop.

FIG. 14 is a circuit diagram illustrating an application in which the data holding device is applied to a D flip-flop (register) having a set/reset function.

As shown in FIG. 14, when forming a D flip-flop, latch circuits are serially connected in two stages (a master and a slave). Since there is no need to make both the master latch circuit and the slave latch circuit nonvolatile, it is sufficient if the present disclosure is only applied to the slave latch circuit.

Figure 15:
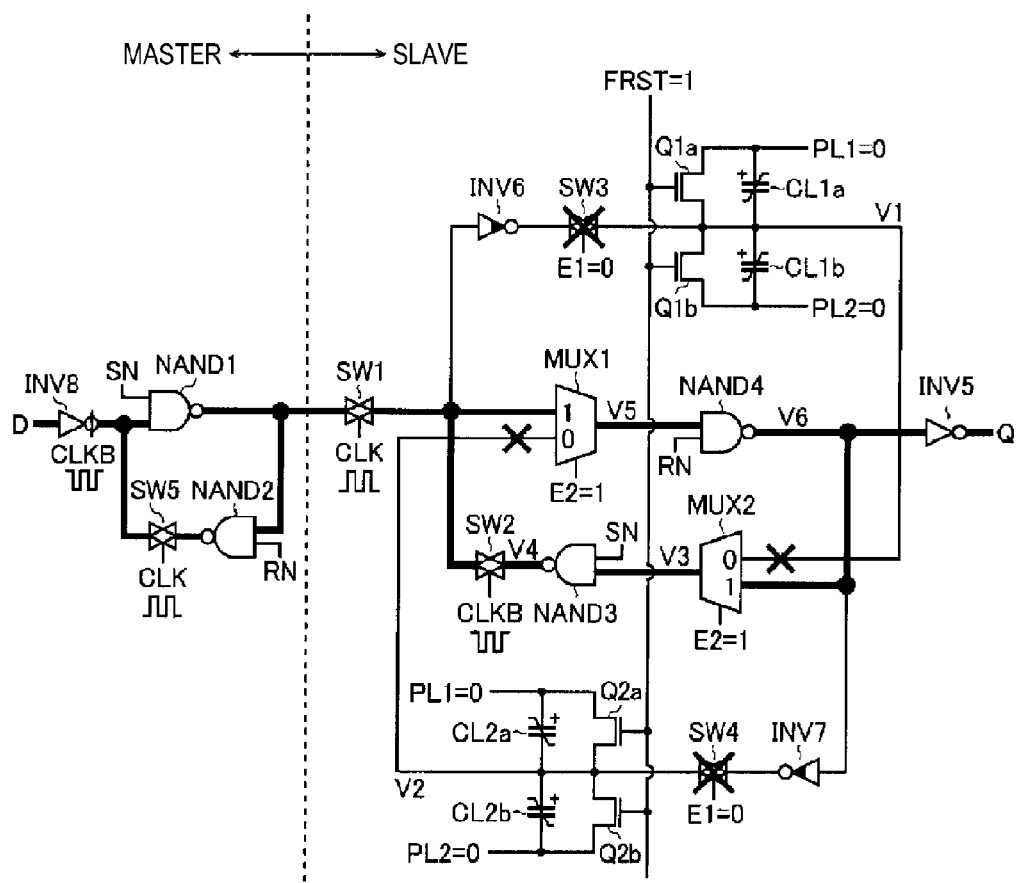
FIG. 15 is a circuit diagram illustrating a signal path during an ordinary operation.
Figure 16:
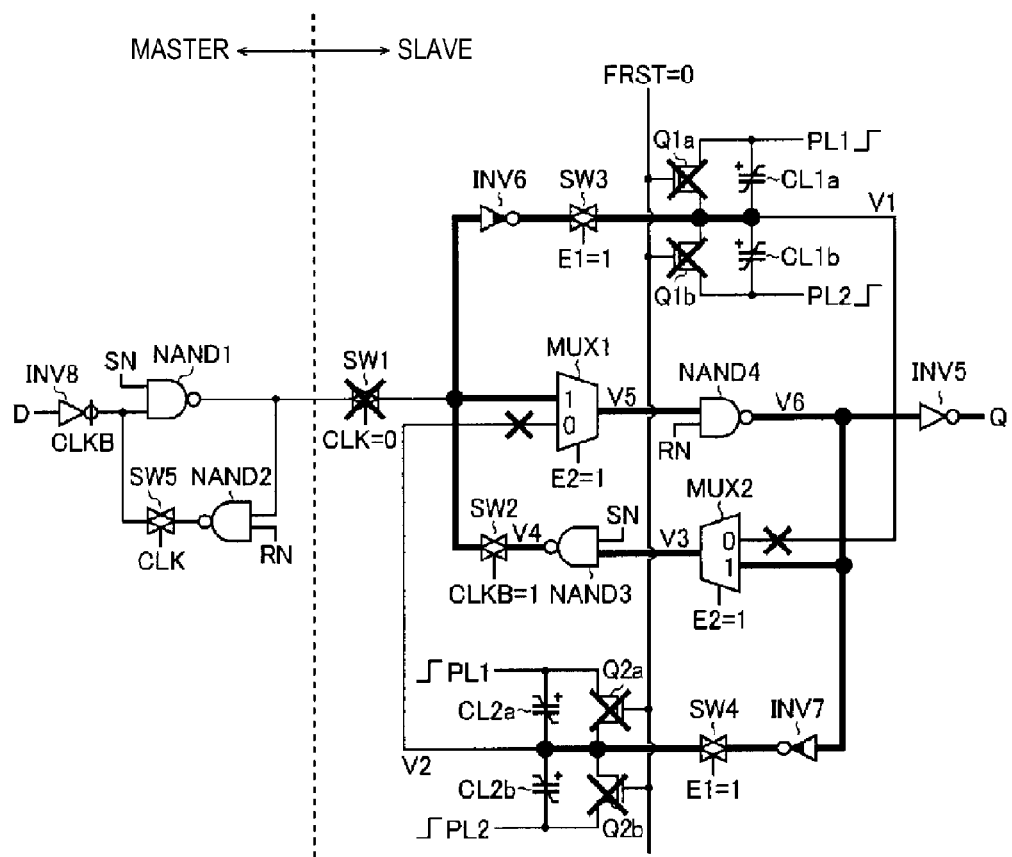
FIG. 16 is a circuit diagram illustrating a signal path during a data writing operation.
Figure 17:
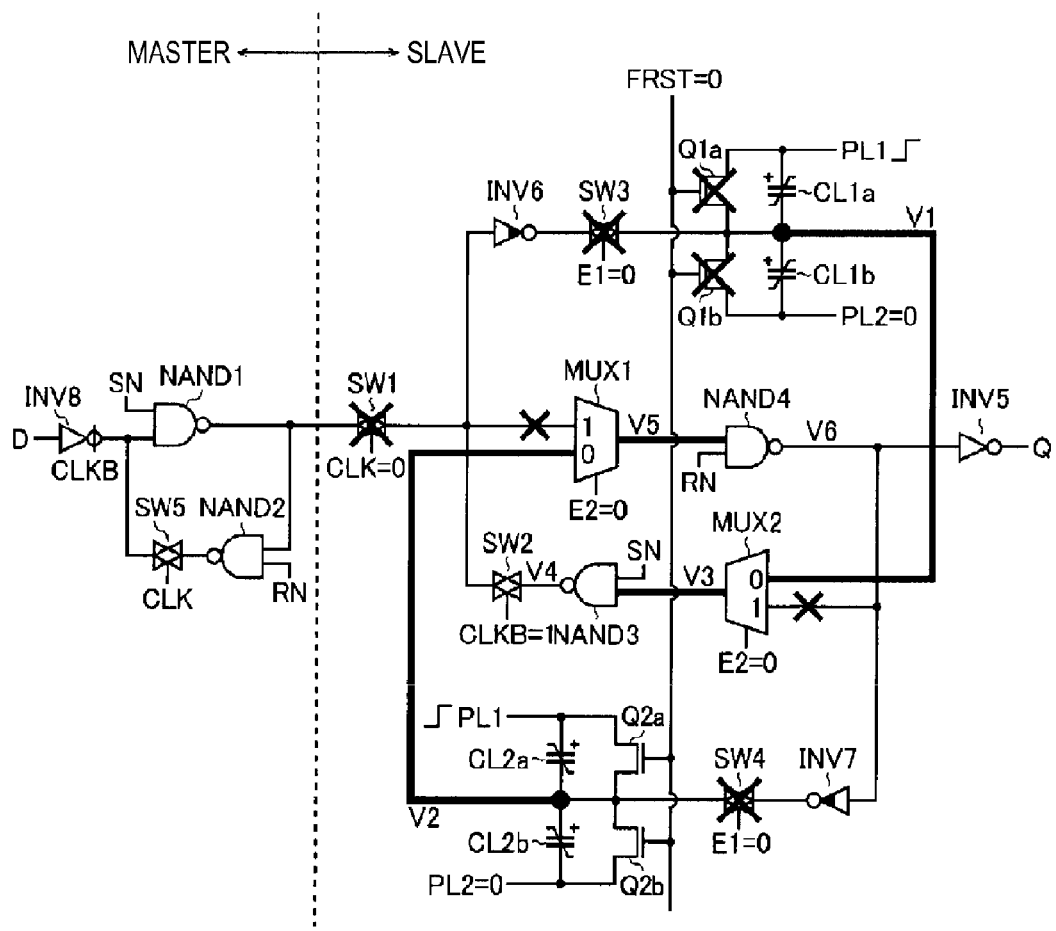
FIG. 17 is a circuit diagram illustrating a signal path during a data reading operation.

Except for the connection of the master latch circuit, the ordinary operation, the operation of writing data on the ferroelectric elements and the operation of reading data from the ferroelectric elements are the same as described above. The signal paths in the respective operations shown in FIGS. 15 through 17 do not need to be repeatedly explained.

In the D flip-flop shown in FIG. 14, however, non-conjunction computing units NAND1 through NAND4, instead of the inverters, are used as the logic gates making up a loop structure unit. If the set signal SN inputted to the non-conjunction computing units NAND1 and NAND3 is kept at "0 (GND)", the output signal Q is compelled to become "1 (VDD1)". If the reset signal RN inputted to the non-conjunction computing units NAND2 and NAND4 is kept at "0 (GND)", the output signal Q is compelled to become "0 (GND)". For that reason, the set signal SN and the reset signal RN need to be kept at "1 (VDD1)" during the data writing operation and the data reading operation.

Figure 18:
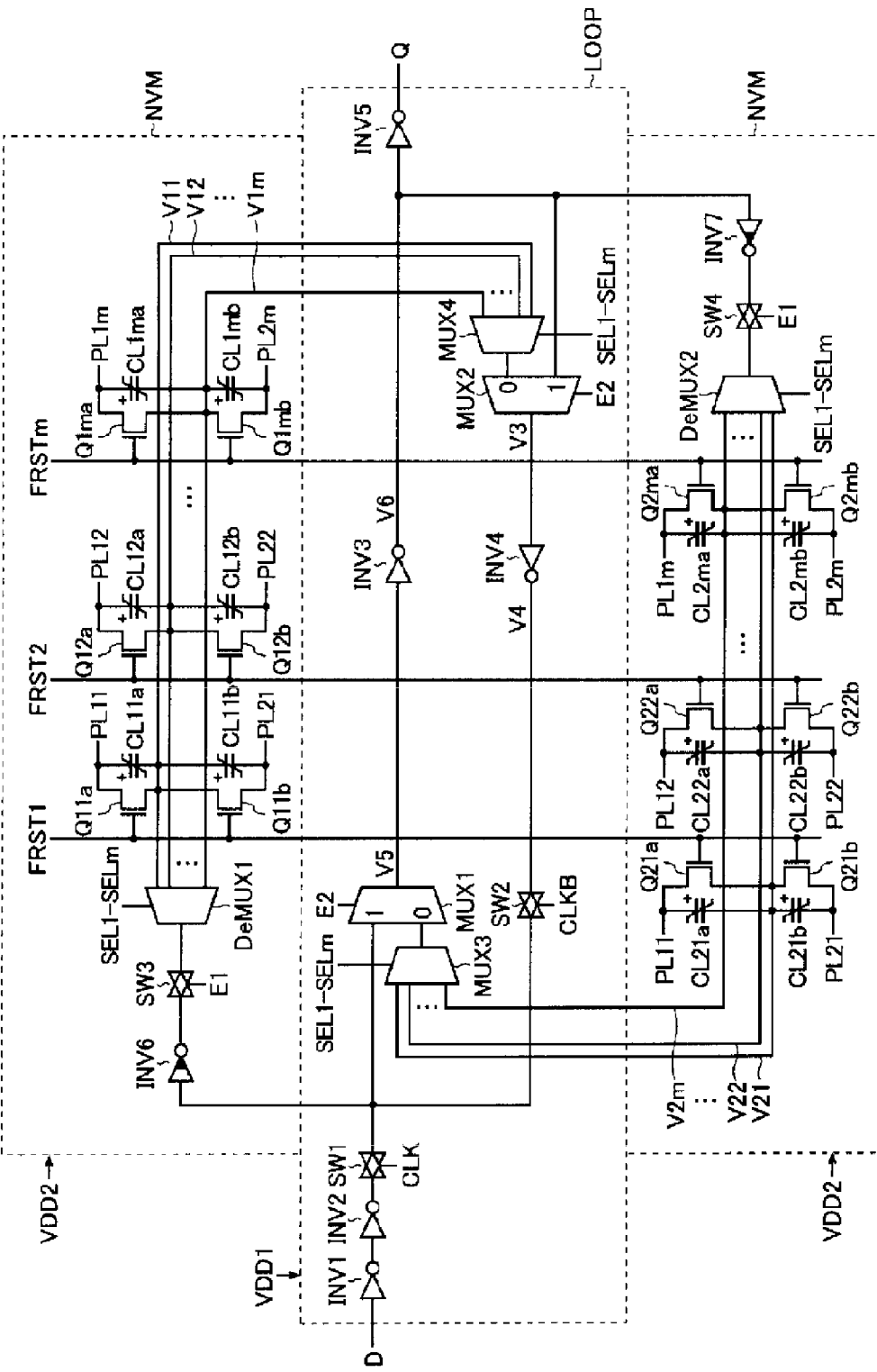
FIG. 18 is a circuit diagram illustrating the data holding device according to the present disclosure.

Next, the data holding device according to some embodiments of the present disclosure will be described in detail with reference to FIG. 18. FIG. 18 is a circuit diagram illustrating the data holding device according to some embodiments of the present disclosure.

The data holding device shown in FIG. 18 is a latch circuit that includes inverters INV1 through INV7, pass switches SW1 through SW4, multiplexers MUX1 through MUX4, demultiplexers DeMUX1 and DeMUX2, N-channel-type field effect transistors Q1$1a$ through Q1$ma$, Q1$1b$ through Q1$mb$, Q2$1a$ through Q2$ma$ and Q2$1b$ through Q2$mb$, and ferroelectric elements (ferroelectric capacitors) CL1$1a$ through CL1$ma$, CL1$1b$ through CL1$mb$, CL2$1a$ through CL2$ma$ and CL2$1b$ through CL2$mb$.

The input terminal of the inverter INV1 is connected to the application terminal of a data signal (D). The output terminal of the inverter INV1 is connected to the input terminal of the inverter INV2. The output terminal of the inverter INV2 is connected to the first input terminal (1) of the multiplexer MUX1 via the first pass switch SW1. The output terminal of the multiplexer MUX1 is connected to the input terminal of the inverter INV3. The output terminal of the inverter INV3 is connected to the input terminal of the inverter INV5. The output terminal of the inverter INV5 is connected to the extraction terminal of an output signal (Q). The first input terminal (1) of the multiplexer MUX2 is connected to the output terminal of the inverter INV3. The output terminal of the multiplexer MUX2 is connected to the input terminal of the inverter INV4. The output terminal of the inverter INV4 is connected to the first input terminal (1) of the multiplexer MUX1 via the second pass switch SW2.

As set forth above, the data holding device according to some embodiments includes a loop structure unit LOOP for holding an input data signal D through the use of two logic gates (the inverters INV3 and INV4 in FIG. 18) connected in a loop shape.

The loop structure unit LOOP is supplied and driven by a first power supply voltage VDD1 (of, e.g., 0.6 V).

The input terminal of the inverter INV6 is connected to the first input terminal (1) of the multiplexer MUX1. The output terminal of the inverter INV6 is connected to the input terminal of the demultiplexer DeMUX1 via the third pass switch SW3. The first through m-th output terminals of the demultiplexer DeMUX1 are respectively connected to the first through m-th input terminals of the multiplexer MUX4. The output terminal of the multiplexer MUX4 is connected to the second input terminal (0) of the multiplexer MUX2.

The input terminal of the inverter INV7 is connected to the first input terminal (1) of the multiplexer MUX2. The output terminal of the inverter INV7 is connected to the input terminal of the demultiplexer DeMUX2 via the fourth pass switch SW4. The first through m-th output terminals of the demultiplexer DeMUX2 are respectively connected to the first through m-th input terminals of the multiplexer MUX3. The output terminal of the multiplexer MUX3 is connected to the second input terminal (0) of the multiplexer MUX1.

The positive terminals of the ferroelectric elements CL1*la* through CL1*ma* are respectively connected to the plate lines PL1*l* through P1*m*. The negative terminals of the ferroelectric elements CL1*la* through CL1*ma* are respectively connected to the first through m-th output terminals of the demultiplexer DeMUX1. The transistors Q1*la* through Q1*ma* are respectively connected between the opposite terminals of the ferroelectric elements CL1*la* through CL1*ma*. The gates of the transistors Q1*la* through Q1*ma* are respectively connected to the terminals for application of F reset signals FRST1 through FRSTm.

The positive terminals of the ferroelectric elements CL1*lb* through CL1*mb* are respectively connected to the first through m-th output terminals of the demultiplexer DeMUX1. The negative terminals of the ferroelectric elements CL1*lb* through CL1*mb* are respectively connected to the plate lines PL2*l* through PL2*m*. The transistors Q1*lb* through Q1*mb* are respectively connected between the opposite terminals of the ferroelectric elements CL1*lb* through CL1*mb*. The gates of the transistors Q1*lb* through Q1*mb* are respectively connected to the terminals for application of F reset signals FRST1 through FRSTm.

The positive terminals of the ferroelectric elements CL2*la* through CL2*ma* are respectively connected to the plate lines PL1*l* through PL1*m*. The negative terminals of the ferroelectric elements CL2*la* through CL2*ma* are respectively connected to the first through m-th output terminals of the demultiplexer DeMUX2. The transistors Q2*la* through Q2*ma* are respectively connected between the opposite terminals of the ferroelectric elements CL2*la* through CL2*ma*. The gates of the transistors Q2*la* through Q2*ma* are respectively connected to the terminals for application of F reset signals FRST1 through FRSTm.

The positive terminals of the ferroelectric elements CL2*lb* through CL2*mb* are respectively connected to the first through m-th output terminals of the demultiplexer DeMUX2. The negative terminals of the ferroelectric elements CL2*lb* through CL2*mb* are respectively connected to the plate lines PL2*l* through PL2*m*. The transistors Q2*lb* through Q2*mb* are respectively connected between the opposite terminals of the ferroelectric elements CL2*lb* through CL2*mb*. The gates of the transistors Q2*lb* through Q2*mb* are respectively connected to the terminals for application of F reset signals FRST1 through FRSTm.

As set forth above, the data holding device according to some embodiments includes a nonvolatile storage unit NVM that stores the data D held in the loop structure unit LOOP in a nonvolatile manner using the hysteresis characteristics of the ferroelectric elements (CL1*la* through CL1*ma*, CL1*lb* through CL1*mb*, CL2*la* through CL2*ma* and CL2*lb* through CL2*mb*).

The nonvolatile storage unit NVM is supplied and driven by a second power supply voltage VDD2 (of, e.g., 1.2 V) higher than the first power supply voltage VDD1.

Among the elements stated above, the first pass switch SW1 is switched on and off in response to a clock signal CLK and the second pass switch SW2 is switched on and off in response to an inverted clock signal CLKB (a logically inverted signal of the clock signal CLK). In other words, the first pass switch SW1 and the second pass switch SW2 are switched on and off in a mutually exclusive (complementary) manner.

On the other hand, the third and fourth pass switches SW3 and SW4 are switched on and off in response to a control signal E1. The signal paths of the multiplexers MUX1 and MUX2 are switched in response to a control signal E2. The signal paths of the multiplexers MUX3 and MUX4 and the demultiplexers DeMUX1 and DeMUX2 are switched in response to control signals SEL1 through SELm. In other words, the multiplexers MUX1 through MUX4, the demultiplexers DeMUX1 and DeMUX2, the inverters INV6 and INV7 and the third and fourth pass switches SW3 and SW4 of the data holding device according to some embodiments function as a circuit separation unit SEP for electrically separating the loop structure unit LOOP and the nonvolatile storage unit NVM.

Among the circuit elements making up the circuit separation unit SEP, the multiplexers MUX1 through MUX4 included in the loop structure unit LOOP are supplied and driven by the first power supply voltage VDD1. The demultiplexers DeMUX1 and DeMUX2 and the third and fourth pass switches SW3 and SW4 included in the nonvolatile storage unit NVM are supplied and driven by the second power supply voltage VDD2.

The inverters INV6 and INV7 are supplied and driven by the first and second power supply voltages VDD1 and VDD2. The inverters INV6 and INV7 function as a level shifter for changing the voltage level of the data D exchanged between the loop structure unit LOOP and the nonvolatile storage unit NVM. Since the circuit configurations of the inverters INV6 and INV7 have been described above, the description thereof will be omitted thereon. As shown in FIG. 7, a three-state inverter INV6' may be used as a substitute for the inverter INV6 and the third pass switch SW3 and a three-state inverter INV7' may be used as a substitute for the inverter INV7 and the fourth pass switch SW4.

The data holding device configured as above further expands the configuration of FIG. 1 to store m bits of the data D (where m≥2). The data holding device is configured to have first through m-th storage regions which can be selected in response to the control signals SEL1 through SELm. Description will be made with respect to some embodiments shown in FIG. 8. The x-th storage region (where 1≤x≤m) is formed of ferroelectric elements CL1*xa*, CL1*xb*, CL2*xa* and CL2*xb* and transistors Q1*xa*, Q1*xb*, Q2*xa* and Q2*xb*. However, the configuration of the present disclosure is not limited thereto but may be modified in the same manner as shown in FIGS. 12 and 13.

Next, description will be made in detail on the operation of the data holding device configured as above. In the following description, the node voltages of the respective parts will be designated by reference symbols. V1*l* through V1*m* denote the voltages appearing at the first through m-th output terminals of the demultiplexer DeMUX1 (the first through m-th input terminals of the multiplexer MUX4). V2*l* through V2*m* denote the voltages appearing at the first through m-th output terminals of the demultiplexer DeMUX2 (the first through m-th input terminals of the multiplexer MUX3). V3 denotes the voltage appearing at the input terminal of the inverter INV4. V4 denotes the voltage appearing at the output terminal of the inverter INV4. V5 denotes the voltage appearing at the input terminal of the inverter INV3. V6 denotes the voltage appearing at the output terminal of the inverter INV3.

Figure 19:
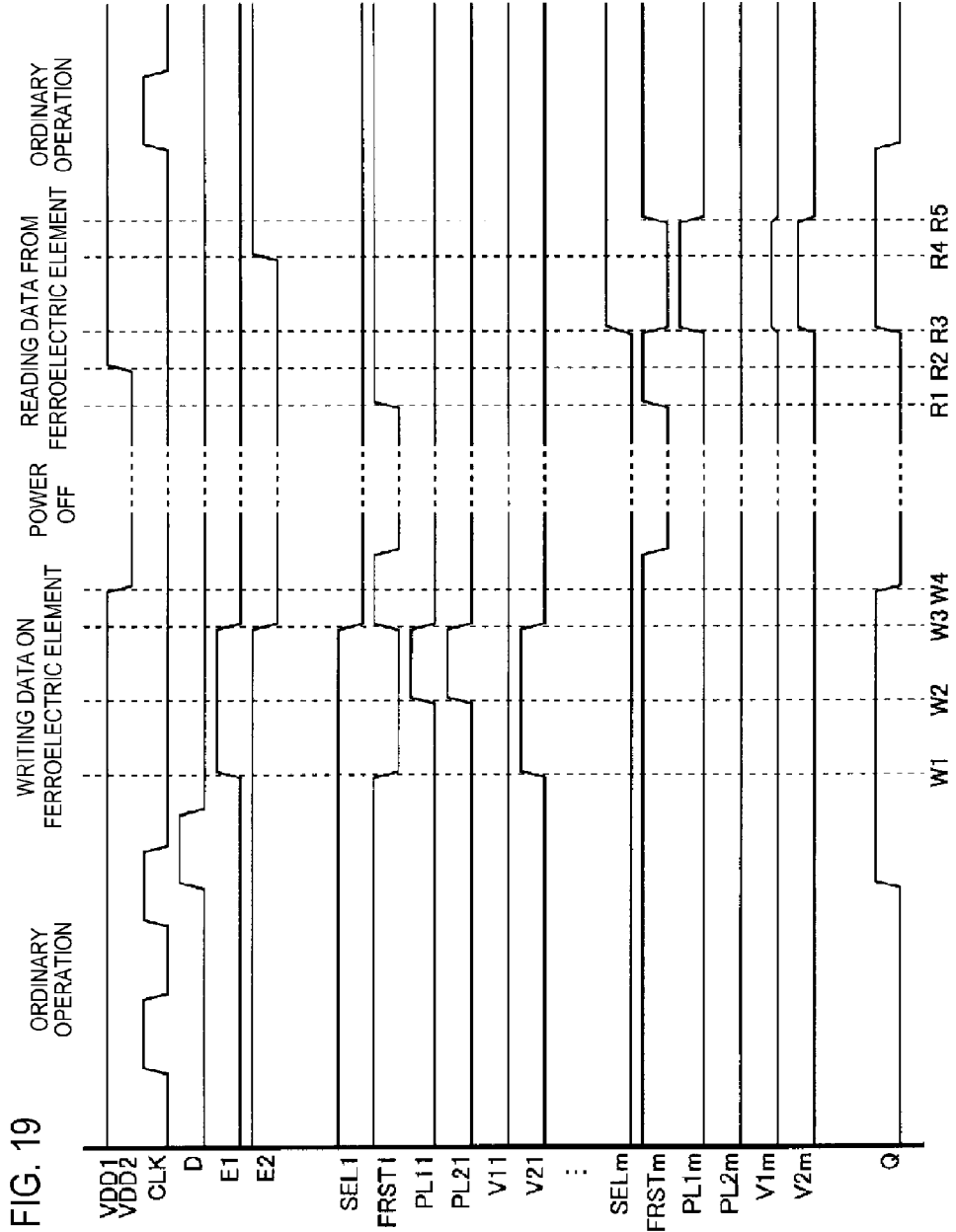
FIG. 19 is a timing chart for explaining one operation of the data holding device according to the present disclosure.

FIG. 19 is a timing chart for explaining one operation example of the data holding device according to the present disclosure (the operation of writing data D on a first storage region and reading data D from the m-th storage region). In FIG. 19, the voltage waveforms of the power supply voltages (VDD1 and VDD2), the clock signal CLK, the data signal D, the control signal E1, the control signal E2, the control signal SEL1, the F reset signal FRST1, the application voltage of the plate line PL1*l*, the application voltage of the plate line PL2*l*, the node voltage V1*l*, the node voltage V2*l*, the control signal SELm, the F reset signal FRSTm, the application voltage of the plate line PL1*m*, the application voltage of the plate line PL2*m*, the node voltage V1*m*, the node voltage V2*m* and the output signal Q are shown in the named order from above.

The control signal SELy, the F reset signal FRSTy, the application voltage of the plate line PL1*y*, the application voltage of the plate line PL2*y*, the node voltage V1*y* and the node voltage V2*y*, which are in relation to the y-th storage region (where 1<y<m), are the same, during the writing operation of the data D, as those of the m-th storage region not selected as a writing target of the data D. Here, the y-th storage region is not selected as a writing target or a reading source of the data D. In addition, the control signal SELy, the F reset signal FRSTy, the application voltage of the plate line PL1*y*, the application voltage of the plate line PL2*y*, the node voltage V1*y* and the node voltage V2*y* are remain the same, during the reading operation of the data D, as those of the first storage region not selected as a reading source of the data D. Therefore, an illustration and description on the control signal SELy, the F reset signal FRSTy, the application voltage of the plate line PL1*y*, the application voltage of the plate line PL2*y*, the node voltage V1*y* and the node voltage V2*y* will be omitted, if appropriate.

First, the ordinary operation of the data holding device will be described.

Up to the time point W1, the F reset signals FRST1 through FRSTm are all kept at "1 (the high level: VDD2)" and the transistors Q1*l*a through Q1*m*a, Q1*l*b through Q1*m*b, Q2*l*a through Q2*m*a, and Q2*l*b through Q2*m*b are all switched on, whereby the respective opposite terminals of the ferroelectric elements CL1*l*a through CL1*m*a, CL1*l*b through CL1*m*b, CL2*l*a through CL2*m*a, and CL2*l*b through CL2*m*b remain short-circuited. In this state, no voltage is applied to the ferroelectric elements CL1*l*a through CL1*m*a, CL1*l*b through CL1*m*b, CL2*l*a through CL2*m*a and CL2*l*b through CL2*m*b. The plate lines PL1*l* through PL1*m* and the plate lines PL2*l* through PL2*m* are kept at "0 (the low level: GND)".

Because up to the time point W1, the control signal E1 is kept at "0 (GND)" and the third and fourth pass switches SW3 and SW4 are switched off, thus the data writing drivers (the inverters INV6 and INV7 as shown in FIG. 18) remain disabled.

Up to the time point W1, the control signal E2 is kept at "1 (VDD1)" and the first input terminals (1) of the multiplexers MUX1 and MUX2 are selected. Thus an ordinary loop is formed in the loop structure unit LOOP.

Accordingly, during the time period in which the clock signal CLK is kept at a high level, the first pass switch SW1 is switched on and the second pass switch SW2 is switched off. Thus, the data signal D is directly outputted as the output signal Q. On the other hand, during the time period in which the clock signal CLK is kept at a low level, the first pass switch SW1 is switched off and the second pass switch SW2 is switched on. Thus, the data signal D is latched at the falling edge of the clock signal CLK.

Next, the operation of writing data on the first storage region will be described.

During the period from the time point W1 to W3, the clock signal CLK is kept at "0 (GND)" and the inverted clock signal CLKB is kept at "1 (VDD1)". Thus, the first pass switch SW1 is switched off and the second pass switch SW2 is switched on. By determining beforehand the logics of the clock signal CLK and the inverted clock signal CLKB in this manner, it is possible to increase the stability of the data writing operation performed with respect to the ferroelectric elements.

During the period from the time point W1 to W3, the control signal SEL1 is kept at "1 (VDD2)" and the remaining control signals SEL2 through SELm are kept at "0 (GND)" in order to select the first storage region as a writing target of the data D. Thus, the demultiplexers DeMUX1 and DeMUX2 come into a state in which a signal path for interconnecting the input terminal and the first output terminal thereof is selected. The multiplexers MUX3 and MUX4 come into a state in which a signal path for interconnecting the output terminal and the first input terminal thereof is selected.

During the period from the time point W1 to the time point W3, the F reset signal FRST1 is kept at "0 (GND)" and the transistors Q1*l*a, Q1*l*b, Q2*l*a and Q2*l*b are switched off. In this state, it becomes possible to apply a voltage to the ferroelectric elements CL1*l*a, CL1*l*b, CL2*l*a and CL2*l*b.

On the other hand, the F reset signals FRST2 through FRSTm continue to be kept at "1 (VDD2)". Thus, data corruption in the second through m-th storage regions may be avoided.

During the period between the time points W1 and W3, the control signal E1 is kept at "1 (VDD2)" and the third and fourth pass switches SW3 and SW4 are switched on. Thus, the data writing drivers (the inverters INV6 and INV7 as shown in FIG. 18) become valid.

Further, the control signal E2 is kept at "1 (VDD1)" as before and the first input terminals (1) of the multiplexers MUX1 and MUX2 are selected. Thus, an ordinary loop is formed in the loop structure unit LOOP.

During the period from the time point W1 to the time point W2, the plate lines PL1*l* and PL2*l* are kept at "0 (GND)". During the period from the time point W2 to the time point W3, the plate lines PL1*l* and PL2*l* are kept at "1 (VDD2)". In other words, an identical pulse voltage is applied to the plate lines PL1*l* and PL2*l*. As the pulse voltage is applied in this manner, the residual polarization state within each of the ferroelectric elements is set into one of an inverted state and a non-inverted state.

Next, FIG. 19 will be described in more detail. At the time point W1, the output signal Q is kept at "1 (VDD1)". The node voltage V1*l* becomes "0 (GND)" and the node voltage V2*l* becomes "1 (VDD1)". Accordingly, if the plate lines PL1*l* and PL2*l* are kept at "0 (GND)" during the period from the time point W1 to the time point W2, no voltage is applied between the opposite terminals of the ferroelectric elements CL1*l*a and CL1*l*b. A negative voltage is applied between the opposite terminals of the ferroelectric element CL2*l*a and a positive voltage is applied between the opposite terminals of the ferroelectric element CL2*l*b. On the other hand, if the plate lines PL1*l* and PL2*l* are kept at "1 (VDD2)" during the period from the time point W2 to the time point W3, no voltage is applied between the opposite terminals of the ferroelectric elements CL2*l*a and CL2*l*b. A positive voltage is applied between the opposite terminals of the ferroelectric element CL1*l*a and a negative voltage is applied between the opposite terminals of the ferroelectric element CL1*l*b.

If the pulse voltage is applied to the plate lines PL1*l* and PL2*l* in this manner, the residual polarization state within each of the ferroelectric elements is set into one of an inverted state and a non-inverted state. Moreover, the residual polarization states are opposite from each other between the ferroelectric elements CL1*l*a and CL1*l*b and between the ferroelectric elements CL2*la* and CL2*lb*. Likewise, the residual polarization states are opposite from each other between the ferroelectric elements CL1*la* and CL2*la* and between the ferroelectric elements CL1*lb* and CL2*lb*.

During the period between the time points W1 to W3, the plate lines PL12 through PL1*m*, and PL22 through PL2*m* remain at "0 (GND)".

At the time point W3, the F reset signal FRST1 becomes "1 (VDD2)" again, whereby the transistors Q1*la*, Q1*lb*, Q2*la* and Q2*lb* are switched on and the respective opposite terminals of the ferroelectric elements CL1*la*, CL1*lb*, CL2*la* and CL2*lb* remain short-circuited. In this state, no voltage is applied to the ferroelectric elements CL1*la*, CL1*lb*, CL2*la* and CL2*lb*. At this time, the plate lines PL1*l* and PL2*l* are kept at "0 (GND)". Likewise, the control signal SEL1 is kept at "0 (GND)".

At the time point W3, the control signal E1 becomes "0 (GND)" again, whereby the third and fourth pass switches SW3 and SW4 are switched off. Thus, the data writing drivers (the inverters INV6 and INV7 as shown in FIG. 18) become disabled. The control signal E2 is kept at "0 (GND)" as shown in FIG. 19, although the control signal E2 has little influence, if any.

At the time point W3, the F reset signals FRST2 through FRSTm remain at "1 (VDD2)". The control signals SEL2 through SELm and the plate lines PL12 through PL1*m*, and PL22 through PL2*m* remain at "0 (GND)".

At the time point W4, the supply of the first power supply voltage VDD1 to the loop structure unit LOOP and the supply of the second power supply voltage VDD2 to the nonvolatile storage unit NVM are all cut off. In this regard, the F reset signals FRST1 through FRSTm continue to be kept at "1 (VDD2)" before the first power supply voltage VDD1 and the second power supply voltage VDD2 are cut off. The transistors Q1*la* through Q1*ma*, Q1*lb* through Q1*mb*, Q2*la* through Q2*ma*, and Q2*lb* through Q2*mb* are switched on. The respective opposite terminals of the ferroelectric elements CL1*la* through CL1*ma*, CL1*lb* through CL1*mb*, CL2*la* through CL2*ma*, and CL2*lb* through CL2*mb* remain short-circuited. Accordingly, no voltage is applied to the ferroelectric elements CL1*la* through CL1*ma*, CL1*lb* through CL1*mb*, CL2*la* through CL2*ma*, and CL2*lb* through CL2*mb*. As a result, even if a voltage is changed when turning the power off, there is no possibility that a voltage is unintentionally applied to the ferroelectric elements CL1*la* through CL1*ma*, CL1*lb* through CL1*mb*, CL2*la* through CL2*ma*, and CL2*lb* through CL2*mb*. This makes it possible to avoid data corruption.

Next, the operation of reading data from the m-th storage region will be described.

During the period from the time point R1 to R5, the clock signal CLK is kept at "0 (GND)" and the inverted clock signal CLKB is kept at "1 (VDD1)". Thus, the first pass switch SW1 is switched off and the second pass switch SW2 is switched on. By determining beforehand the logics of the clock signal CLK and the inverted clock signal CLKB in this manner, it is possible to increase the stability of the operation of reading data from the ferroelectric elements.

At the time point R1, all the F reset signals FRST1 through FRS™ are initially kept at "1 (VDD2)" and the transistors Q1*la* through Q1*ma*, Q1*lb* through Q1*mb*, Q2*la* through Q2*ma*, and Q2*lb* through Q2*mb* are switched on. The respective opposite terminals of the ferroelectric elements CL1*la* through CL1*ma*, CL1*lb* through CL1*mb*, CL2*la* through CL2*ma*, and CL2*lb* through CL2*mb* remain short-circuited. Accordingly, no voltage is applied to the ferroelectric elements CL1*la* through CL1*ma*, CL1*lb* through CL1*mb*, CL2*la* through CL2*ma*, and CL2*lb* through CL2*mb*. As a result, even if a voltage is changed at the power-on time, there is no possibility that a voltage is unintentionally applied to the ferroelectric elements CL1*la* through CL1*ma*, CL1*lb* through CL1*mb*, CL2*la* through CL2*ma*, and CL2*lb* through CL2*mb*. This makes it possible to avoid data corruption.

At the time point R1, the plate lines PL1*l* through PL1*m*, and PL2*l* through PL2*m* are kept at "0 (the low level: GND)".

At the time point R2, the control signals E1 and E2 are kept at "0 (GND)." Specifically, the data writing drivers become disabled and the ordinary loop become disabled in the loop structure unit LOOP. In a state with the above configuration, the control signal E1 is applied to the first power supply voltage VDD1 corresponding to the loop structure unit LOOP, and the control signal E2 is applied to the second power supply voltage VDD2 corresponding to the nonvolatile storage unit NVM.

Then, at the time point R3, the control signal SELm is kept at "1 (VDD2)" and the remaining control signals SEL1 through SEL(m−1) are kept at "0 (GND)" in order to select the m-th storage region as a reading source of the data D. Thus, the demultiplexers DeMUX1 and DeMUX2 come into a state in which a signal path for interconnecting the input terminal and the m-th output terminal thereof is selected. The multiplexers MUX3 and MUX4 come into a state in which a signal path for interconnecting the output terminal and the m-th input terminal thereof is selected.

At the time point R3, the F reset signal FRSTm is kept at "0 (GND)" and the transistors Q1*ma*, Q1*mb*, Q2*ma* and Q2*mb* are switched on. Thus, it becomes possible to apply a voltage to the ferroelectric elements CL1*ma*, CL1*mb*, CL2*ma* and CL2*mb*. On the other hand, the plate line PL1*m* is kept at "1 (VDD2)" while the plate line PL2*m* is kept at "0 (GND)". By applying the pulse voltage in this manner, voltage signals corresponding to the residual polarization states within the ferroelectric elements appear as node voltages V1*m* and V2*m*.

FIG. 19 will be described in detail when the data D of logic "1" is stored in the m-th storage region. WL appears as the logic of the node voltage V1*m* and WH appears as the logic of the node voltage V2*m*. In other words, a voltage difference corresponding to the difference in the residual polarization states within the ferroelectric elements is generated between the node voltages V1*m* and V2*m*.

During the period from the time point R3 to the time point R4, the control signal E2 is kept at "0 (GND)" and the second input terminals (0) of the multiplexers MUX1 and MUX2 are selected. Thus, the logic of the node voltage V3 becomes WL and the logic of the node voltage V4 becomes WH. In addition, the logic of the node voltage V5 becomes WH and the logic of the node voltage V6 becomes WL. As set forth above, during the period from the time point R3 to the time point R4, the node voltages V1*m*, V2*m* and V3 through V6 in the respective parts of the data holding device is still unstable (the logics are not completely inverted in the inverters INV3 and INV4 and the output logics thereof are not reliably kept at "0 (GND) "/"1 (VDD1)").

At the time point R3, the F reset signals FRST1 through FRST(m−1) remain at "1 (VDD2)". The control signals SEL1 through SEL(m−1) and the plate lines PL1*l* through PL1(*m*-1) and PL21 through PL2(*m*-1) remain at "0 (GND)".

Then, at the time point R4, the control signal E2 is kept at "1 (VDD1)" and the first input terminals (1) of the multiplexers MUX1 and MUX2 are selected. Thus, an ordinary loop is formed in the loop structure unit LOOP. As the signal paths are switched in this manner, the output terminal of the inverter INV4 (having the logic WH) and the input terminal of the inverter INV3 (having the logic WH) are connected to each other and the output terminal of the inverter INV3 (having the logic WL) and the input terminal of the inverter INV4 (having the logic WL) are connected to each other. Accordingly, mismatching is not generated in the signal logics (WH/WL) of the respective nodes. During the time period in which an ordinary loop is formed in the loop structure unit LOOP, the inverter INV3 receives the input of the logic WL and raises the output logic thereof to "1 (VDD1)". The inverter INV4 receives the input of the logic WH and lowers the output logic thereof to "0 (GND)". As a result, the output logic of the inverter INV3 changes from the unstable logic WL to "0 (GND)". The output logic of the inverter INV4 changes from the unstable logic WH to "1 (VDD1)".

As stated above, at the time point R4, the signal read out from the ferroelectric elements (the electric potential difference between the node voltage V1$m$ and the node voltage V2$m$) is amplified in the loop structure unit LOOP as the loop structure unit LOOP becomes the ordinary loop. The data held in the third storage region (the "1 (VDD1)" as shown in FIG. 19) is restored as the output signal Q.

Thereafter, at the time point R5, the F reset signal FRSTm becomes "1 (VDD2)" again and the transistors Q1$ma$, Q1$mb$, Q2$ma$ and Q2$mb$ are switched on, whereby the respective opposite terminals of the ferroelectric elements CL1$ma$, CL1$mb$, CL2$ma$ and CL2$mb$ remain short-circuited. In this state, no voltage is applied to the ferroelectric elements CL1$ma$, CL1$mb$, CL2$ma$ and CL2$mb$. At this time, the plate line PL1$m$ and the plate line PL2$m$ are kept at "0 (GND)". Accordingly, the data holding device comes back to the same state as available before the time point W1, i.e., the ordinary operation state.

In the data holding device described above, the nonvolatile storage unit NVM for storing the data D held in the loop structure unit LOOP in a nonvolatile manner using the hysteresis characteristics of the ferroelectric elements includes m storage regions formed of ferroelectric elements. The storage regions as writing targets and reading sources of the data D are selected and used in response to a predetermined control signals SEL1 through SELm. With this configuration, it is possible to realize a data holding device capable of arbitrarily switching and using a plurality of data D.

Inasmuch as the ferroelectric elements are separated from the signal line during the ordinary operation of the data holding device, there is no possibility that the increase in the number of the ferroelectric elements leads to the deterioration of performance of the data holding device (e.g., the reduction in speed and the increase in power consumption).

Figure 20:
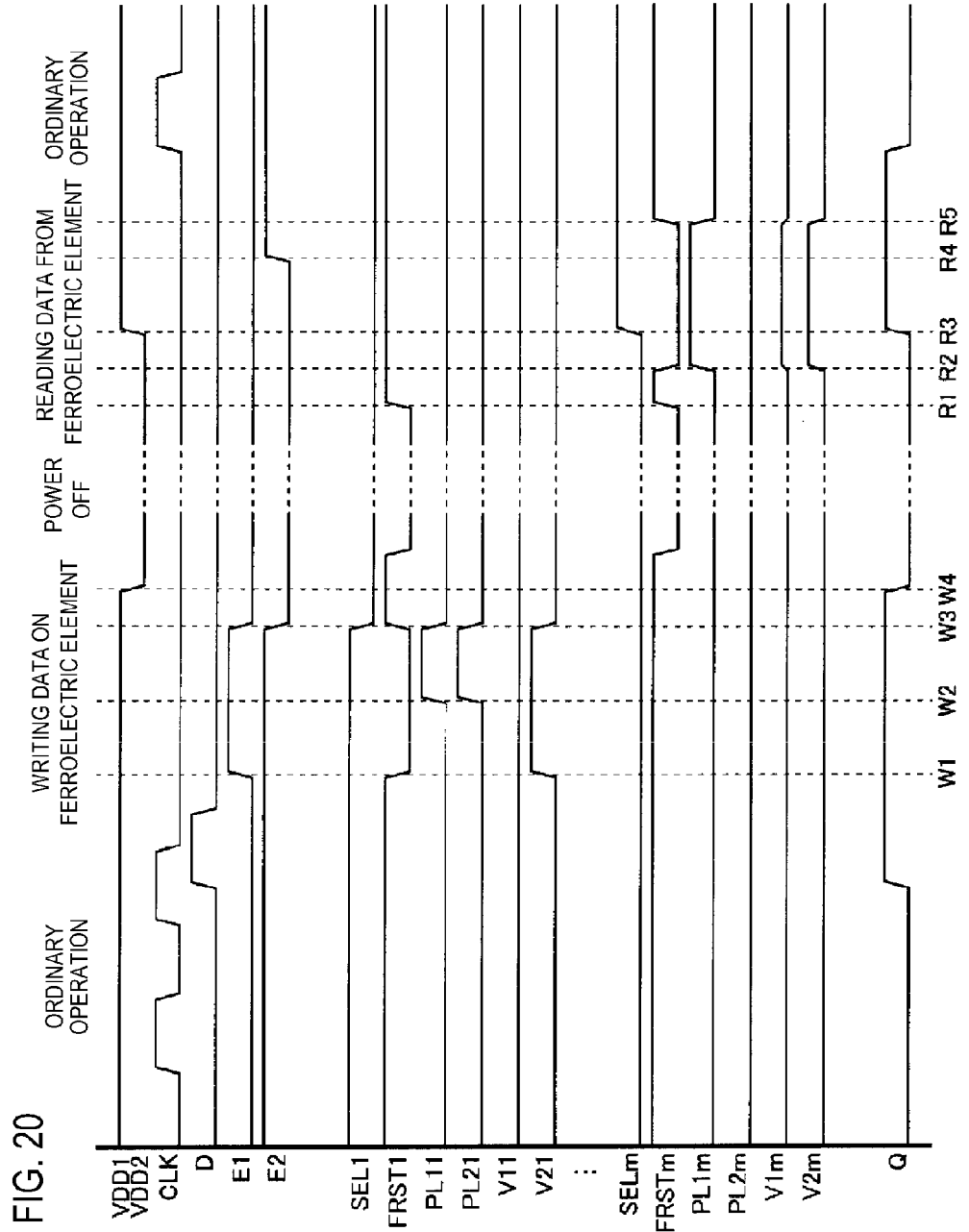
FIG. 20 is a timing chart for explaining another operation of the data holding device according to the present disclosure.

Next, one modified operation of reading data from the m-th storage region according to some embodiments will be described with reference to FIG. 20. FIG. 20 is a timing chart for explaining another operation of the data holding device according to some embodiments the present disclosure. In FIG. 20, the voltage waveforms of the power supply voltages (VDD1 and VDD2), the clock signal CLK, the data signal D, the control signal E1, the control signal E2, the control signal SEL1, the F reset signal FRST1, the application voltage of the plate line PL1$l$, the application voltage of the plate line PL2$l$, the node voltage V1$l$, the node voltage V2$l$, the control signal SELm, the F reset signal FRSTm, the application voltage of the plate line PL1$m$, the application voltage of the plate line PL2$m$, the node voltage V1$m$, the node voltage V2$m$ and the output signal Q are shown in the named order from above.

The control signal SELy, the F reset signal FRSTy, the application voltage of the plate line PL1$y$, the application voltage of the plate line PL2$y$, the node voltage V1$y$ and the node voltage V2$y$ relating to the y-th storage region (where 1<y<m) are the same, during the writing operation of the data D, as those of the m-th storage region not selected as a writing target of the data D. Here, the y-th storage region is not selected as a writing target or a reading source of the data D. In addition, the control signal SELy, the F reset signal FRSTy, the application voltage of the plate line PL1$y$, the application voltage of the plate line PL2$y$, the node voltage V1$y$ and the node voltage V2$y$ relating to the y-th storage region remain the same, during the reading operation of the data D, as those of the first storage region not selected as a reading source of the data D. Therefore, illustration and description on the control signal SELy, the F reset signal FRSTy, the application voltage of the plate line PL1$y$, the application voltage of the plate line PL2$y$, the node voltage V1$y$ and the node voltage V2$y$ will be omitted, if appropriate.

During the period from the time point R1 to the time point R5, the clock signal CLK is kept at "0 (GND)" and the inverted clock signal CLKB is kept at "1 (VDD1)". Thus, the first pass switch SW1 is switched off and the second pass switch SW2 is switched on. By determining beforehand the logics of the clock signal CLK and the inverted clock signal CLKB in this manner, it is possible to increase the stability of the operation of reading data from the ferroelectric elements.

At the time point R1, the F reset signals FRST1 through FRSTm are initially kept at "1 (VDD2)" and the transistors Q1$la$ through Q1$ma$, Q1$lb$ through Q1$mb$, Q2$la$ through Q2$ma$, and Q2$lb$ through Q2$mb$ are switched on. The respective opposite terminals of the ferroelectric elements CL1$la$ through CL1$ma$, CL1$lb$ through CL1$mb$, CL2$la$ through CL2$ma$, and CL2$lb$ through CL2$mb$ remain short-circuited. Accordingly, no voltage is applied to the ferroelectric elements CL1$la$ through CL1$ma$, CL1$lb$ through CL1$mb$, CL2$la$ through CL2$ma$, and CL2$lb$ through CL2$mb$. As a result, even if a voltage is changed at the power-on time, there is no possibility that a voltage is unintentionally applied to the ferroelectric elements CL1$la$ through CL1$ma$, CL1$lb$ through CL1$mb$, CL2$la$ through CL2$ma$, and CL2$lb$ through CL2$mb$. This makes it possible to avoid data corruption.

At the time point R1, the plate lines PL11 through PL1$m$ and PL21 through PL2$m$ are kept at "0 (the low level: GND)".

At the time point R2, the F reset signal FRSTm is kept at "0 (GND)" and the transistors Q1$ma$, Q1$mb$, Q2$ma$ and Q2$mb$ are switched on. Thus it becomes possible to apply a voltage to the ferroelectric elements CL1$ma$, CL1$mb$, CL2$ma$ and CL2$mb$. On the other hand, the plate line PL1$m$ is kept at "1 (VDD2)" while the plate line PL2$m$ is kept at "0 (GND)". As the pulse voltage is applied in this manner, voltage signals corresponding to the residual polarization states within the ferroelectric elements appear as node voltages V1$m$ and V2$m$.

FIG. 20 will be described in detail when the data D of logic "1" is stored in the third storage region. WL appears as the logic of the node voltage V1$m$ and WH appears as the logic of the node voltage V2$m$. In other words, a voltage difference corresponding to the difference in the residual polarization states within the ferroelectric elements is generated between the node voltages V1$m$ and V2$m$.

During the period from the time point R2 to the time point R3, the first power supply voltage VDD1 is not yet applied. Thus, the node voltages V3 through V6 of the respective parts of the loop structure unit LOOP become "0 (GND)". Consequently, the output signal Q is kept at "0 (GND)".

Then, at the time point R3, the control signal SELm is kept at "1 (VDD2)" and the remaining control signals SEL1 through SEL(m−1) are kept at "0 (GND)" in order to select the m-th storage region as a reading source of the data D. Thus, the demultiplexers DeMUX1 and DeMUX2 come into a state in which a signal path for interconnecting the input terminal and the m-th output terminal thereof is selected. The multiplexers MUX3 and MUX4 come into a state in which a signal path for interconnecting the output terminal and the m-th input terminal thereof is selected.

At the time point R3, the first power supply voltage VDD1 is applied to the loop structure unit LOOP and the second power supply voltage VDD2 is applied to the nonvolatile storage unit NVM, in a state that the control signals E1 and E2 are all kept at "0 (GND)" Specifically, that the state is when the data writing drivers become disabled and the ordinary loop become disabled in the loop structure unit LOOP).

During the period from the time point R3 to the time point R4, the control signal E2 is kept at "0 (GND)" and the second input terminals (0) of the multiplexers MUX1 and MUX2 are selected. Thus, the logic of the node voltage V3 becomes WL and the logic of the node voltage V4 becomes WH. In addition, the logic of the node voltage V5 becomes WH and the logic of the node voltage V6 becomes WL. As set forth above, during the period from the time point R3 to the time point R4, the node voltages V1 through V6 in the respective parts of the data holding device is still unstable because the logics are not completely inverted in the inverters INV3 and INV4 and the output logics thereof are not reliably kept at "0 (GND)"/"1 (VDD1)".

Then, at the time point R4, the control signal E2 is kept at "1 (VDD1)" and the first input terminals (1) of the multiplexers MUX1 and MUX2 are selected. Thus, an ordinary loop is formed in the loop structure unit LOOP. As the signal paths are switched in this manner, the output terminal of the inverter INV4 (having the logic WH) and the input terminal of the inverter INV3 (having the logic WH) are connected to each other and the output terminal of the inverter INV3 (having the logic WL) and the input terminal of the inverter INV4 (having the logic WL) are connected to each other. Accordingly, mismatching is not generated in the signal logics (WH/WL) of the respective nodes. During the time period in which an ordinary loop is formed in the loop structure unit LOOP, the inverter INV3 receives the input of the logic WL and raises the output logic thereof to "1 (VDD1)". The inverter INV4 receives the input of the logic WH and lowers the output logic thereof to "0 (GND)". As a result, the output logic of the inverter INV3 changes from the unstable logic WL to "0 (GND)". The output logic of the inverter INV4 changes from the unstable logic WH to "1 (VDD1)".

As stated above, at the time point R4, the signal read out from the ferroelectric elements (the electric potential difference between the node voltage V1$m$ and the node voltage V2$m$) is amplified in the loop structure unit LOOP as the loop structure unit LOOP becomes the ordinary loop. The data held in the third storage region (the "1 (VDD1)" as shown in FIG. 20) is restored as the output signal Q.

Thereafter, at the time point R5, the F reset signal FRSTm becomes "1 (VDD2)" again and the transistors Q1$ma$, Q1$mb$, Q2$ma$ and Q2$mb$ are switched on, whereby the respective opposite terminals of the ferroelectric elements CL1$ma$, CL1$mb$, CL2$ma$ and CL2$mb$ remain short-circuited. In this state, no voltage is applied to the ferroelectric elements CL1$ma$, CL1$mb$, CL2$ma$ and CL2$mb$. At this time, the plate line PL1$m$ and the plate line PL2$m$ are kept at "0 (GND)". Accordingly, the data holding device comes back to the same state as available before the time point W1, i.e., the ordinary operation state.

Unlike the data reading operation shown in FIG. 19, the data reading operation shown in FIG. 20 is configured such that the extraction operation of the voltage signals (the node voltages V1$m$ and V2$m$) corresponding to the residual polarization states within the ferroelectric elements is started prior to applying the first power supply voltage VDD1 and the second power supply voltage VDD2. With this configuration, it is possible to reduce the number of operation steps performed after applying the first power supply voltage VDD1 and the second power supply voltage VDD2. That is, the operation shown in FIG. 20 requires only two steps at the time points R4 and R5 while the operation shown in FIG. 19 requires three steps at the time points R3, R4 and R5. Thus, shorten the time required in coming back to the ordinary operation may be shortened.

<CPU Processing Switchover Operation>

Figure 21:
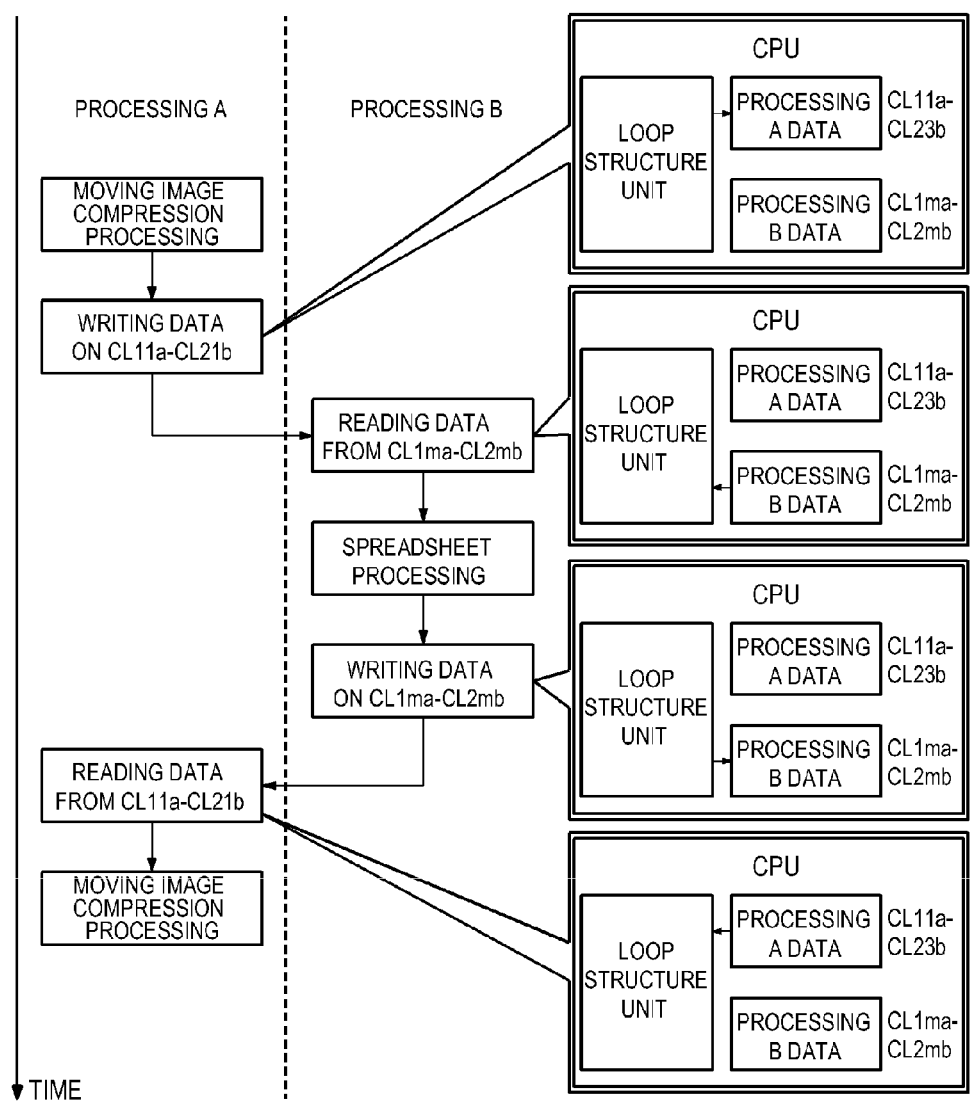
FIG. 21 is a schematic diagram illustrating a processing switchover operation performed by data replacement.

Next, a processing switchover operation in case of the data holding device of FIG. 18 being applied to a CPU will be described with reference to FIG. 21. FIG. 21 is a schematic diagram illustrating a processing switchover operation performed by data replacement according to some embodiments. Schematically shown in FIG. 21 is a situation that processing A (e.g., moving image compression processing) and processing B (e.g., spreadsheet processing) are alternately switched over by switching the first storage region and the m-th storage region of the data holding device. The left side in FIG. 21 illustrates a situation in which the processing A and the processing B are alternately switched over along the vertical axis indicating the time. The right side in FIG. 21 schematically illustrates an operation state of the data holding device used within a CPU.

When shifting the processing A to the processing B, the data holding device performs replacement of the data stored therein by writing the data DA concerned with the processing A into the first storage region (CL1$la$ through CL2$lb$) and reading the data DB concerned with the processing B from the m-th storage region (CL1$ma$ through CL2$mb$). On the other hand, when shifting the processing B to the processing A, the data holding device performs replacement of the data stored therein by writing the data DB concerned with the processing B into the m-th storage region (CL1$ma$ through CL2$mb$) and reading the data DA concerned with the processing A from the first storage region (CL1$la$ through CL2$lb$). With the data replacement processing stated above, it becomes possible to instantaneously switch different kinds of processing executed in the CPU.

In the event that the CPU processing switchover operation is performed by the data replacement, the power-off period shown in FIGS. 19 and 20 is not necessarily required.

<Cell Pattern>

Next, the layouts of a cell pattern of the ferroelectric elements will be described in detail with reference to FIGS. 22 through 25. FIGS. 22 through 25 are schematic diagrams illustrating first through fourth layout examples of a cell pattern of the ferroelectric elements. In the figures, reference symbols a through d designate the ferroelectric elements and reference symbols x and y designate the distances between the ferroelectric elements.

When forming a plurality of ferroelectric elements on a semiconductor substrate, all the ferroelectric elements are designed in a layout step to have an identical shape (e.g., a square shape or a rectangular shape when seen from above). However, it is often the case that, due to the process characteristics, the actual elements formed on the semiconductor substrate by way of a masking process and an etching process do not have the same shape as designed.

Figure 22:
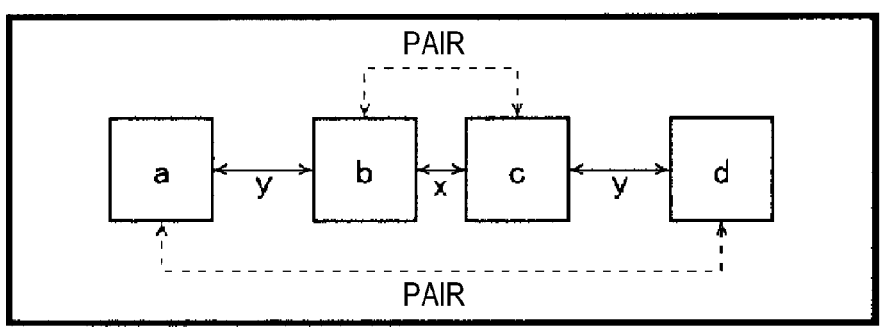
FIG. 22 is a schematic diagram illustrating a layout of a cell pattern according to some embodiments.
Figure 22:
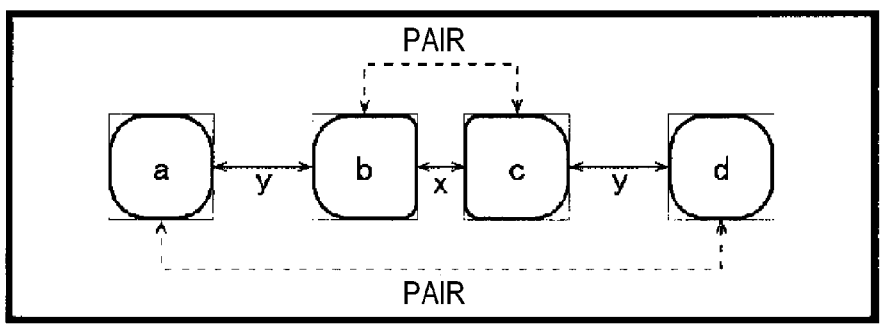

Referring to FIG. 22, no other element adjoins to four sides of each of the ferroelectric elements a and d. Thus the corner portions of the ferroelectric elements a and d are etched with ease. The actual ferroelectric elements a and d formed on the semiconductor substrate are shaped such that all the four corners of each of the elements are relatively heavily rounded. On the other hand, the ferroelectric elements b and c adjoin to each other in such a fashion that one side of one of the elements is opposed to one side of the other element. Thus, the corner portions included in the opposing sides of each of the elements are not etched with ease. The actual ferroelectric elements b and c formed on the semiconductor substrate are shaped such that the two mutually opposing corners among the four corners of each of the elements are relatively lightly rounded while the remaining two corners are relatively heavily rounded. FIGS. 23A through 25 shares similar elements as FIG. 22.

As set forth above, the actual elements formed on the semiconductor substrate are shaped such that the etching degrees of the four corners vary depending on the density of the elements. The pair of the ferroelectric elements CL1a and CL1b and the pair of the ferroelectric elements CL2a and CL2b may be arranged so that each pair of the ferroelectric elements formed on the semiconductor substrate can be identical in actual shape.

Figure 23A:
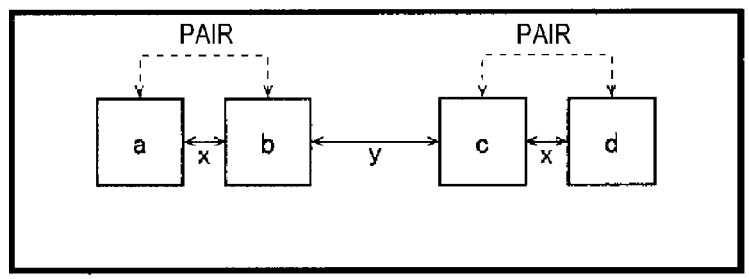
FIGS. 23A and 23B are schematic diagrams illustrating a layout of the cell pattern according to another embodiment.
Figure 23A:
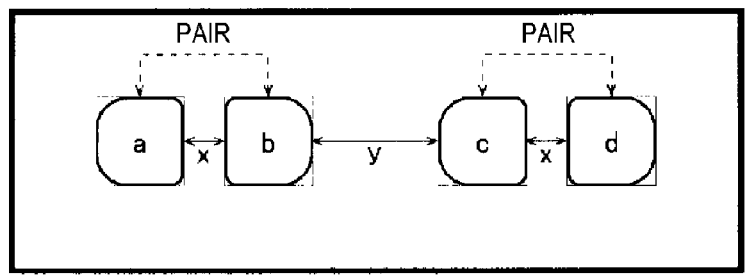
Figure 23B:
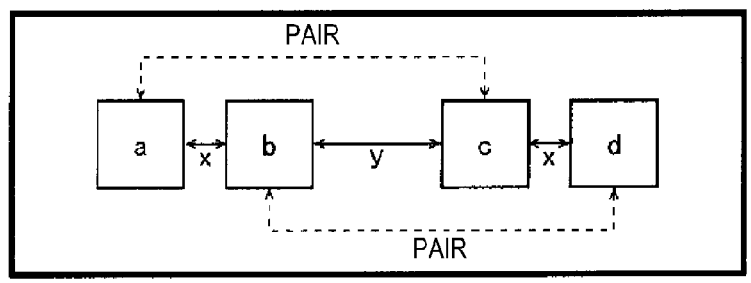
Figure 23B:
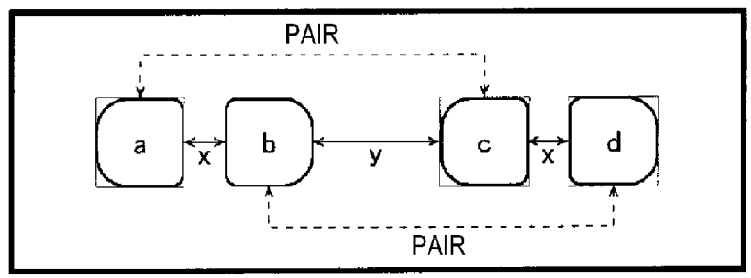
Figure 24A:
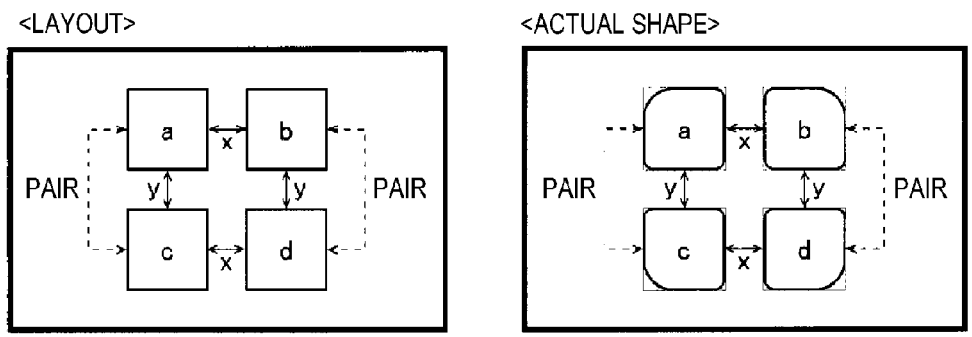
FIGS. 24A through 24C are schematic diagrams illustrating a layout of the cell pattern according to another embodiment.
Figure 24B:
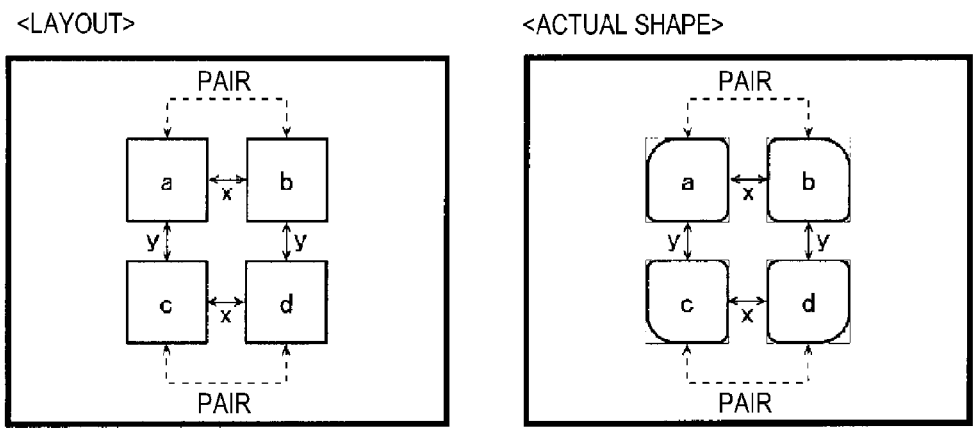
Figure 24C:
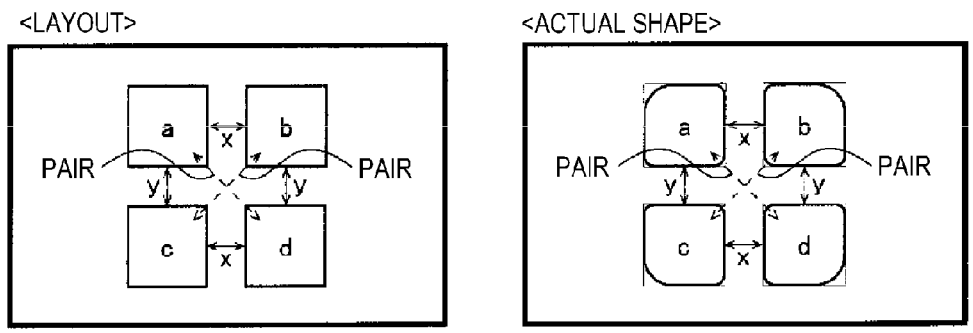
Figure 25:
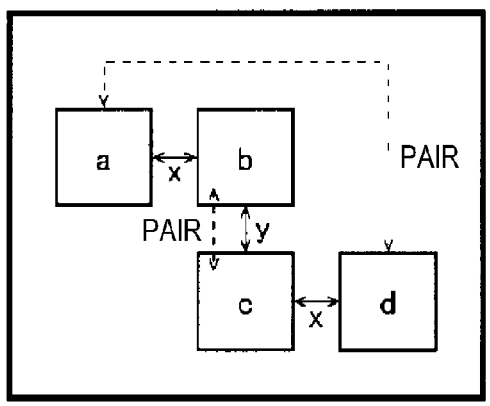
FIG. 25 is a schematic diagram illustrating a layout of the cell pattern according to another embodiment.
Figure 25:
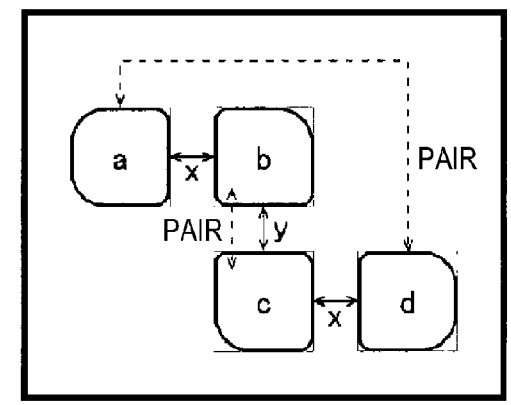

In FIG. 22, the ferroelectric elements a and d make up a first pair and the ferroelectric elements b and c make up a second pair. In FIGS. 23A and 23B, the ferroelectric elements a and b make up a first pair and the ferroelectric elements c and d make up a second pair (see FIG. 23A). Alternatively, the ferroelectric elements a and c may make up a first pair and the ferroelectric elements b and d may make up a second pair (see FIG. 23B). In FIGS. 24A, 24B, and 24C, the ferroelectric elements a and c make up a first pair and the ferroelectric elements b and d make up a second pair (see FIG. 24A). Alternatively, the ferroelectric elements a and b may make up a first pair and the ferroelectric elements c and d may make up a second pair (see FIG. 24B). Alternatively, the ferroelectric elements a and d may make up a first pair and the ferroelectric elements b and c may make up a second pair (see FIG. 24C). In FIG. 25, the ferroelectric elements a and d make up a first pair and the ferroelectric elements b and c make up a second pair.

By employing the cell pattern layouts stated above, it becomes possible to match the shapes (areas) of the ferroelectric elements making up one pair, thereby increasing the pairing property thereof. Consequently, the data holding performance of the data holding device may be enhanced.

In case of providing a plurality of storage regions as shown in FIG. 18, it is equally important to match the shapes (areas) of the ferroelectric elements in the pair of the ferroelectric elements CL1la through CL1ma and the ferroelectric elements CL1lb through CL1mb and in the pair of the ferroelectric elements CL2la through CL2ma and the ferroelectric elements CL2lb through CL2mb.

<Dummy Pattern>

Figure 26:
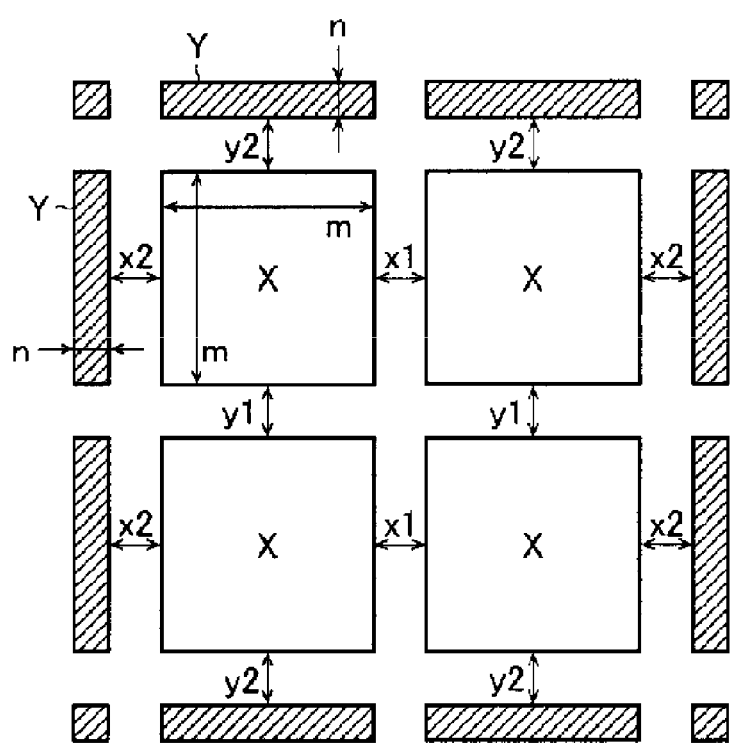
FIG. 26 is a schematic diagram illustrating a layout of a dummy pattern according to some embodiments.

FIG. 26 is a schematic diagram illustrating a layout of a dummy pattern according to some embodiments.

Four ferroelectric elements (ferroelectric capacitors) X correspond to the ferroelectric elements CL1a, CL1b, CL2a and CL2b shown in FIG. 1. Each of the ferroelectric elements X is formed into a square shape of m×m in size (for example, m=2.8 μm). However, the shape of the ferroelectric elements X is not limited thereto but may be, e.g., a rectangular shape.

The four ferroelectric elements X are arranged in a two-row two-column lattice shape in conformity with the layout shown in FIGS. 24A through 24C. By employing this cell pattern layout, it becomes possible to match the shapes (areas) of the ferroelectric elements making up one pair, thereby increasing the pairing property thereof. Consequently, the data holding performance of the data holding device may be enhanced.

The inter-element distance x1 running in the row direction between the ferroelectric elements X and the inter-element distance y1 running in the column direction between the ferroelectric elements X may be set equal to each other in an effort to suppress the etching loading effect attributable to the density of a mask pattern.

Dummy elements Y are formed adjacent to the ferroelectric elements X in the same layer as the layer of the ferroelectric elements X. The dummy elements Y refer to the elements not used in reality (the ferroelectric capacitors not electrically connected to other elements). The dummy elements Y are arranged to surround the four ferroelectric elements X.

The width n of the dummy elements Y is set smaller than the width m of the ferroelectric elements X. In order to maximize the chip area efficiency, the width n of the dummy elements Y may be set equal to the minimum dimension defined in the manufacturing process of a semiconductor integrated circuit device. In reality, however, there is a need to take the patterning difficulty into account. For example, under a 0.13 μm process rule, it is proper to set the width n of the dummy elements Y equal to about 0.4 μm.

The inter-element distance x2 spaced apart from each other in the row direction between the ferroelectric elements X and the dummy elements Y may be equal to the inter-element distance x1 spaced apart from each other in the row direction between the ferroelectric elements X with a view to suppress the etching loading effect attributable to the density of a mask pattern. Similarly, the inter-element distance y2 spaced apart from each other in the column direction between the ferroelectric elements X and the dummy elements Y may be equal to the inter-element distance y1 spaced apart from each other in the column direction between the ferroelectric elements X with a view to suppress the etching loading effect attributable to the density of a mask pattern.

With the configuration in which the ferroelectric elements X are surrounded by the dummy elements Y smaller in width than the ferroelectric elements X, the ratio of the area occupied by the dummy elements Y to the total area of the data holding device may be reduced. Accordingly, any unnecessary increase in the chip area may be avoided and variations in the characteristics of the ferroelectric elements X attributable to the density of a mask pattern may be reduced. This makes it possible to increase the reliability and throughput of the data holding device.

Figure 27:
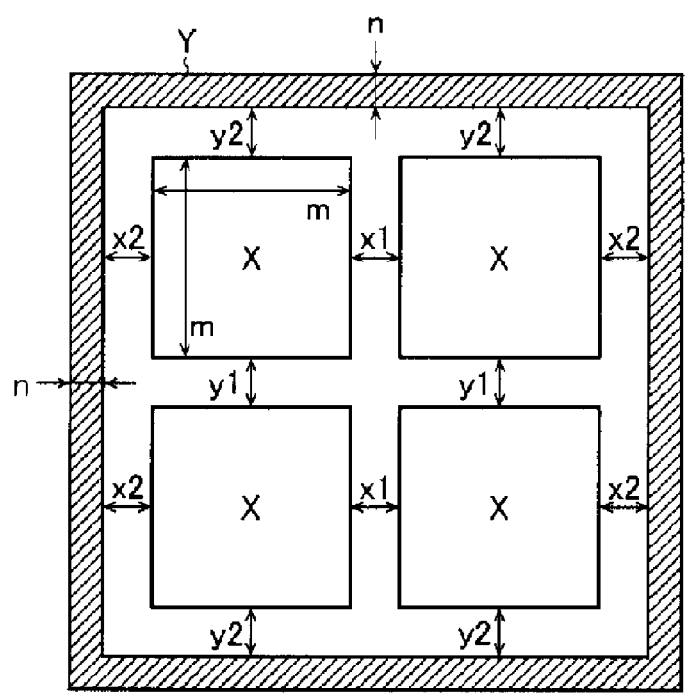
FIG. 27 is a schematic diagram illustrating a layout of the dummy pattern according to another embodiment.
Figure 28A:
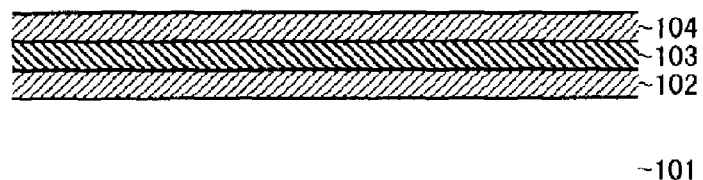
FIGS. 28A through 28D are vertical section views illustrating a manufacturing process of ferroelectric elements X and dummy elements Y.
Figure 28B:
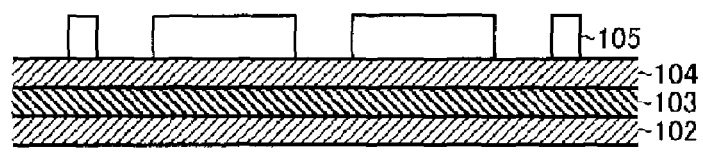
Figure 28C:
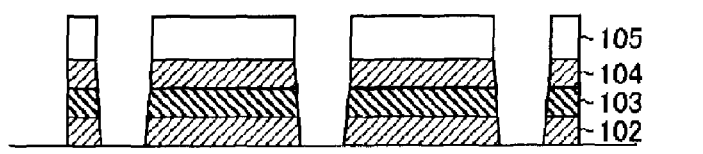
Figure 28D:
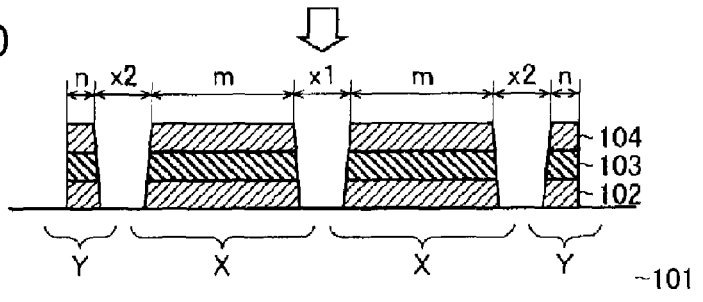

FIG. 27 is a schematic diagram illustrating a layout of the dummy pattern according to some embodiments. In this layout, a dummy element Y is formed into a ring-shape to completely surround the ferroelectric elements X. With this configuration, resist falling is hard to occur in a lithography process. This makes it possible to design the dummy element Y to have a smaller width n. Consequently, the chip area may be reduced or the size of the ferroelectric elements X may be increased (to enhance the characteristics of the data holding device).

FIGS. 28A through 28D are vertical section views illustrating a manufacturing process of the ferroelectric elements X and the dummy elements Y.

In the first step, a lower electrode layer 102, a ferroelectric layer 103 and an upper electrode layer 104 are formed on a substrate 101 one above another. The portions of the lower electrode layer 102 belonging to the ferroelectric elements X are electrically connected to a variety of circuits formed on the substrate 101. On the other hand, the portions of the lower electrode layer 102 belonging to the dummy elements Y are kept in an electrically floating state.

In the second step, a resist layer 105 is formed on the upper electrode layer 104. Unnecessary portions of the resist layer 105 except for the regions covering the ferroelectric elements X and the dummy elements Y are removed to thereby form a mask pattern.

In the third step, the unnecessary portions of the lower electrode layer 102, the ferroelectric layer 103 and the upper electrode layer 104 not covered with the mask pattern are removed by etching. The etching degree (including the taper) varies depending on the density of the mask pattern. Since the dummy elements Y are arranged around the ferroelectric elements X, the etching degrees of a plurality of the ferroelectric elements X are made uniform.

In the fourth step, the resist layer 105 is removed to finish the ferroelectric elements X and the dummy elements Y. The portions of the upper electrode layer 104 belonging to the ferroelectric elements X are electrically connected to a wiring layer additionally formed above the upper electrode layer 104. The portions of the upper electrode layer 104 belonging to the dummy elements Y are kept in an electrically floating state.

Figure 29A:
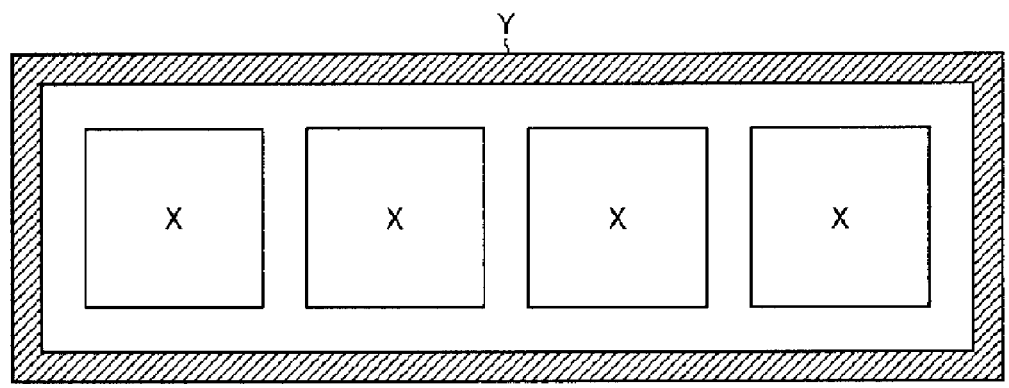
FIG. 29A is a schematic diagram illustrating a layout of the dummy pattern according to another embodiment.
Figure 29B:
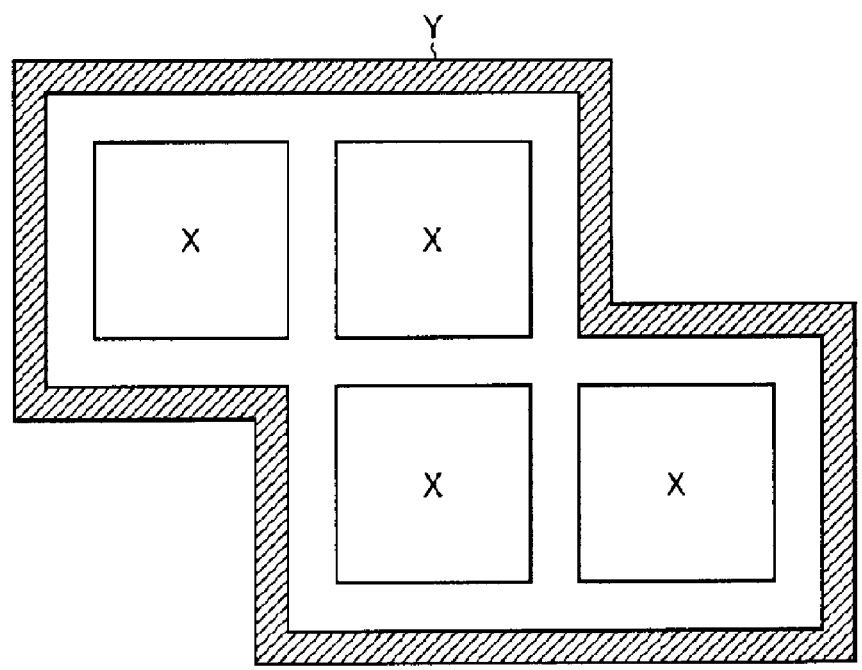
FIG. 29B is a schematic diagram illustrating a layout of the dummy pattern according to another embodiment.
Figure 31:
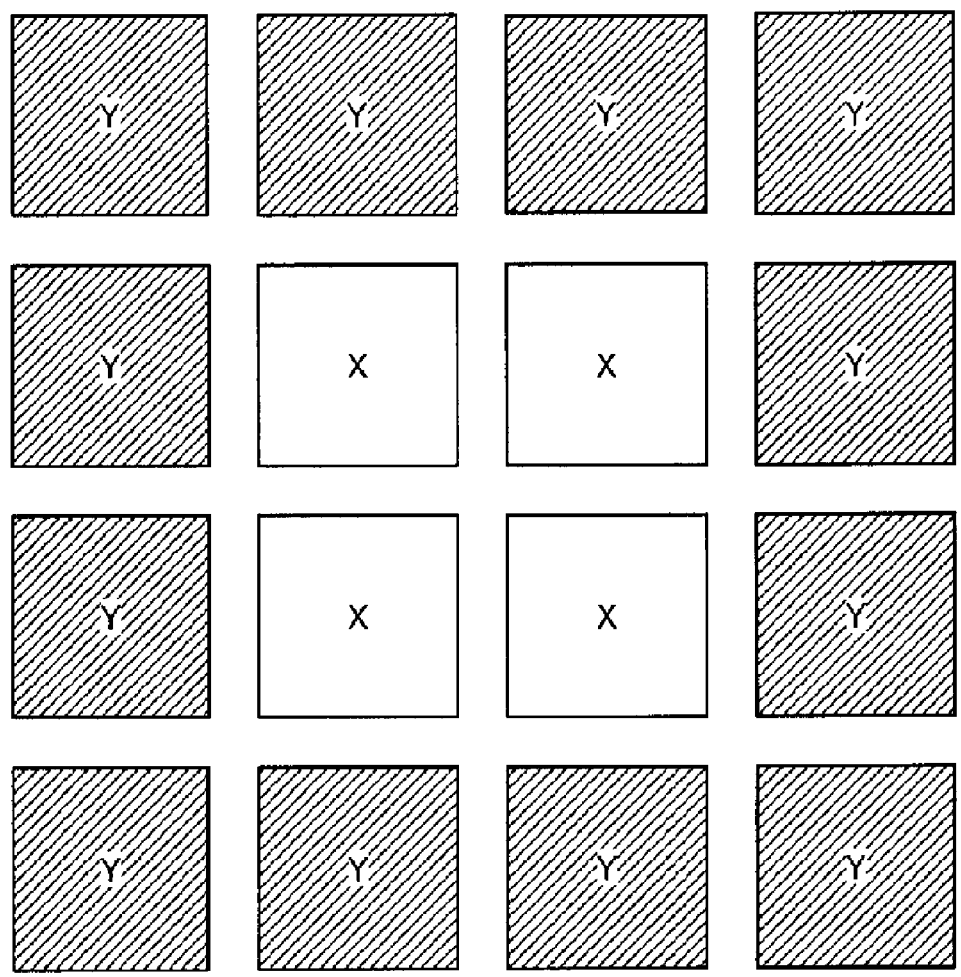
FIG. 31 is a schematic diagram illustrating another dummy pattern.

While the dummy pattern using the cell pattern layout shown in FIGS. 24 A through 24C has been described with reference to FIGS. 26 and 27 by way of example, the configuration of the present disclosure is not limited thereto. As shown in FIG. 29A, the dummy pattern may be based on the cell pattern layout shown in FIG. 22 or FIGS. 23A and 23B. As shown in FIG. 29B, the dummy pattern may be based on the cell pattern layout shown in FIG. 25.

The configuration of the present disclosure is not limited to the embodiment described above but may be modified in many different forms without departing from the scope and spirit of the present disclosure. In other words, it should be appreciated that the embodiment described above is not limitative but illustrative in all respects. The technical scope of the present disclosure is not limited to the embodiment described above but is defined by the claims. It should be understood that all modifications falling within the scope and spirit of the claims and their equivalents are included in the technical scope of the present disclosure.

The present disclosure is useful in making nonvolatile a data holding device mounted to a logic operation circuit, a logic operation device, a processor such as a CPU, an MPU or a DSP, and a mobile device.

According to the present disclosure, it is possible to provide a data holding device capable of appropriately reducing variations in the characteristics of ferroelectric elements attributable to the density of a mask pattern, and a logic operation circuit using the data holding device.

While one embodiment has been described, this embodiment has been presented by way of example only, and is not intended to limit the scope of the disclosures. Indeed, the novel device described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A data holding device comprising a nonvolatile storage unit including a plurality of ferroelectric elements, wherein the ferroelectric elements included in the nonvolatile storage unit are surrounded by a dummy element, and a width of the dummy element is smaller than a width of the ferroelectric elements.

2. The device of claim 1, wherein the dummy element is formed into a closed circular shape.

3. The device of claim 1, wherein a first inter-element distance corresponds to a distance between two adjacent ferroelectric elements among the ferroelectric elements that are spaced apart from each other, a second inter-element distance corresponds to a distance between one of the ferroelectric elements and the dummy element that are adjacent to each other, and the first inter-element distance and the second inter-element distance are set equal to each other.

4. A logic operation circuit comprising the data holding device of claim 1 as a latch or a register.

5. A data holding device comprising a nonvolatile storage unit including a plurality of ferroelectric elements, wherein the ferroelectric elements included in the nonvolatile storage unit are surrounded by a dummy element that is formed into a closed circular shape.

6. The device of claim 5, wherein a first inter-element distance corresponds to a distance between two adjacent ferroelectric elements among the ferroelectric elements that are spaced apart from each other, a second inter-element distance corresponds to a distance between one of the ferroelectric elements and the dummy element that are adjacent to each other, and the first inter-element distance and the second inter-element distance are set equal to each other.

7. A logic operation circuit comprising the data holding device of claim 5 as a latch or a register.

* * * * *